(12) United States Patent
Okada et al.

(10) Patent No.: US 7,256,496 B2
(45) Date of Patent: Aug. 14, 2007

(54) SEMICONDUCTOR DEVICE HAVING ADHESION INCREASING FILM TO PREVENT PEELING

(75) Inventors: Osamu Okada, Hamura (JP); Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/143,293

(22) Filed: Jun. 1, 2005

(65) Prior Publication Data

US 2005/0269698 A1    Dec. 8, 2005

(30) Foreign Application Priority Data

Jun. 2, 2004    (JP) ............................. 2004-164363

(51) Int. Cl.
*H01L 23/48* (2006.01)
*H01L 21/44* (2006.01)
(52) U.S. Cl. ............................. 257/737; 257/E23.178; 257/E21.512; 257/778; 257/753; 257/758; 257/774; 257/E23.065; 257/E23.055; 257/E23.067; 257/E23.069; 257/772; 257/779; 257/780; 257/668
(58) Field of Classification Search ........ 257/E23.178, 257/E21.512, E23.065, E23.055, E23.067, 257/E23.069, 778, 734, 737, 738, 669, 772, 257/779, 780, 758, 753, 774, 668
See application file for complete search history.

(56) References Cited

U.S. PATENT DOCUMENTS 6,472,727 B2 * 10/2002 Miyazaki et al. ........... 257/668

| | | | |
|---|---|---|---|
| 6,822,705 B2 * | 11/2004 | Shimoda et al. | 349/62 |
| 6,940,008 B2 * | 9/2005 | Shiotsuka et al. | 136/251 |
| 7,080,446 B2 * | 7/2006 | Baba et al. | 29/832 |
| 2003/0189403 A1 * | 10/2003 | Yamada et al. | 313/511 |

FOREIGN PATENT DOCUMENTS

| | | |
|---|---|---|
| JP | 10-256279 A | 9/1998 |
| JP | 2001-244383 A | 9/2001 |
| JP | 2003-249691 A | 9/2003 |
| JP | 2003-298005 A | 10/2003 |
| JP | 2004-71998 A | 3/2004 |

* cited by examiner

*Primary Examiner*—Alexander Oscar Williams
(74) *Attorney, Agent, or Firm*—Frishauf, Holtz, Goodman & Chick, P.C.

(57) ABSTRACT

A semiconductor device includes at least one semiconductor constructing body provided on one side of a base member, and having a semiconductor substrate and a plurality of external connecting electrodes provided on the semiconductor substrate. An insulating layer is provided on the one side of the base member around the semiconductor constructing body. An adhesion increasing film is formed between the insulating layer, and at least one of the semiconductor constructing body and the base member around the semiconductor constructing body, for preventing peeling between the insulating layer and the at least one of the semiconductor constructing body and base member.

11 Claims, 29 Drawing Sheets

SEMICONDUCTOR DEVICE HAVING ADHESION INCREASING FILM TO PREVENT PEELING

CROSS-REFERENCE TO RELATED APPLICATIONS

This application is based upon and claims the benefit of priority from prior Japanese Patent Application No. 2004-164363, filed Jun. 2, 2004, the entire contents of which are incorporated herein by reference.

BACKGROUND OF THE INVENTION

1. Field of the Invention

The present invention relates to a semiconductor device having an adhesion increasing film and a method of fabricating the same.

2. Description of the Related Art

A conventional semiconductor device disclosed in Jpn. Pat. Appln. KOKAI Publication No. 2003-298005 includes solder balls as connecting terminals disposed outside a plane size of a silicon substrate. Therefore, this semiconductor device has a structure in which a silicon substrate having a plurality of connecting pads on its upper surface is adhered to the upper surface of a base plate via an adhesive layer, an insulating layer is formed on the upper surface of the base plate around the silicon substrate, an upper insulating film is formed on the upper surfaces of the silicon substrate and insulating layer, upper interconnections are formed on the upper surface of the upper insulating film and respectively connected to the connecting pads of the silicon substrate, portions except for connecting pad portions of the upper interconnections are covered with an uppermost insulating film, and solder balls are formed on the connecting pad portions of the upper interconnections.

In the above conventional semiconductor device, the side surfaces of the silicon substrate and the upper surface of the base plate are covered with an insulating layer made of, e.g., polyimide or epoxy resin. This decreases the adhesion between the side surfaces of the silicon substrate and the insulating layer or between the upper surface of the base plate and the insulating layer. As a consequence, thermal stress or mechanical stress causes peeling between the silicon substrate and insulating layer or between the base plate and insulating layer.

BRIEF SUMMARY OF THE INVENTION

It is an object of the present invention to provide a semiconductor device capable of increasing the adhesion between a semiconductor substrate such as a silicon substrate and an insulating layer which covers the side surfaces of the semiconductor substrate, or the adhesion between a base member such as a base plate and an insulating layer which covers the upper surface of the base member, and a method of fabricating this semiconductor device.

According to an aspect of the present invention, there is provided a semiconductor device comprising:

a base member;

at least one semiconductor constructing body provided on one side of the base member, and having a semiconductor substrate and a plurality of external connecting electrodes provided on the semiconductor substrate;

an insulating layer provided on said one side of the base member around the semiconductor constructing body; and an adhesion increasing film which is formed between the insulating layer, and at least one of the semiconductor constructing body and the base member around the semiconductor constructing body, for preventing peeling between the insulating layer and said at least one of the semiconductor constructing body and base member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
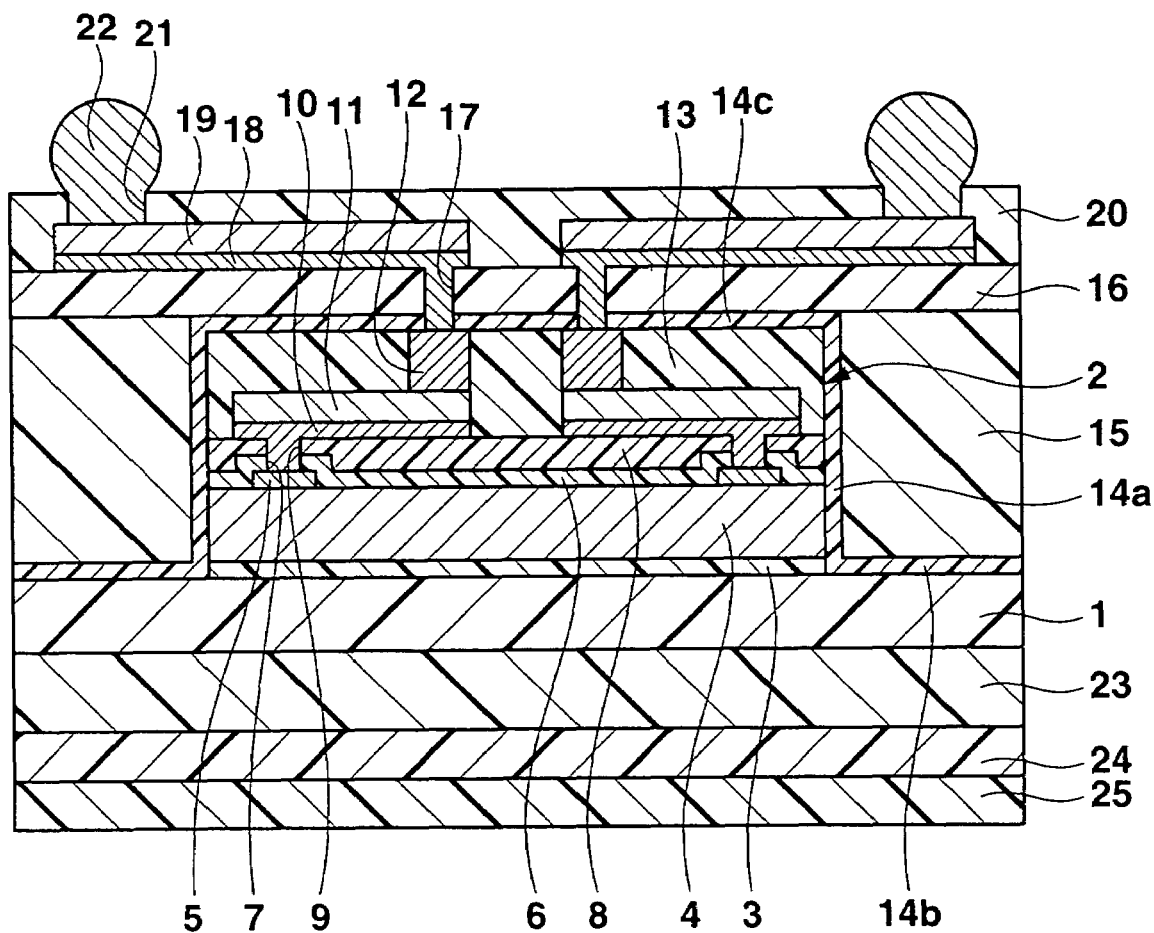
FIG. 1 is a sectional view of a semiconductor device according to the first embodiment of the present invention.

FIG. 1 is a sectional view of a semiconductor device as the first embodiment of the present invention. This semiconductor device includes a base plate (base member) 1 having a square planar shape. The base plate 1 can be any material normally used as a printed board. An example is a material obtained by impregnating a base material made of, e.g., glass cloth, glass fibers, or aramid fibers with thermosetting resin such as epoxy-based resin, polyimide-based resin, or BT (Bismaleimide Triazine) resin, or a material made only of thermosetting resin such as epoxy-based resin.

The lower surface of a semiconductor constructing body 2 having a square planar shape of a size somewhat smaller than that of the base plate 1 is adhered to the upper surface of the base plate 1 via an adhesive layer 3 made of a die bonding material. The semiconductor constructing body 2 has interconnections 11, columnar electrodes 12, and a sealing film 13 (all of which will be explained later), and is generally called a CSP (Chip Size Package). The semiconductor constructing body 2 is also particularly called a wafer level CSP (W-CSP) because individual semiconductor constructing bodies 2 are obtained by dicing after the interconnections 11, columnar electrodes 12, and sealing film 13 are formed on a silicon wafer as will be described later. The structure of the semiconductor constructing body 2 will be explained below.

The semiconductor constructing body 2 includes a silicon substrate (semiconductor substrate) 4. The lower surface of the silicon substrate 4 is adhered to the upper surface of the base plate 1 via the adhesive layer 3. An integrated circuit (not shown) having a predetermined function is formed on the upper surface of the silicon substrate 4. A plurality of connecting pads 5 made of, e.g., an aluminum-based metal are formed on the periphery of the upper surface of the silicon substrate 4, and electrically connected to the integrated circuit. An insulating film 6 made of silicon oxide or the like is formed on the upper surface of the silicon substrate 4 and the connecting pads 5, except for central portions of the connecting pads 5. These central portions of the connecting pads 5 are exposed through holes 7 formed in the insulating film 6.

A protective film 8 made of, e.g., epoxy-based resin or polyimide-based resin is formed on the upper surface of the insulating film 6. Holes 9 are formed in those portions of the protective film 8, which correspond to the holes 7 in the insulating film 6. A plurality of metal undercoatings 10 made of copper or the like are formed on the upper surface of the protective film 8. The copper interconnections 11 are formed on the entire upper surfaces of the metal undercoatings 10. One end portion of each interconnection 11 including the metal undercoating 10 is electrically connected to the connecting pad 5 through the holes 7 and 9.

The columnar electrodes (external connecting electrodes) 12 made of copper are formed on the upper surfaces of connecting pad portions of the respective interconnections 11. The sealing film 13 made of, e.g., epoxy-based resin or polyimide-based resin is formed on the upper surface of the protective film 8 and the interconnections 11, such that the upper surface of the sealing film 13 is leveled with the upper surfaces of the columnar electrodes 12. As described above, the semiconductor constructing body 2 called a W-CSP includes the silicon substrate 4, connecting pads 5, and insulating film 6, and also includes the protective film 8, interconnections 11, columnar electrodes 12, and sealing film 13.

Adhesion increasing films 14a, 14b, and 14c made of, e.g., a silane coupling agent are continuously formed on the side surfaces, preferably all side surface of the semiconductor constructing body 2, on the upper surface of the base plate 1 at least around the semiconductor constructing body 2, and on the upper surface of the semiconductor constructing body 2. An insulating layer 15 having a square frame-like planar shape is formed on the upper surface of the adhesion increasing film 14b formed on the upper surface of the base plate 1 to contact with the adhesion increasing film 14a formed on the side surfaces (peripheral side surface) of the semiconductor constructing body 2, such that the upper surface of the insulating layer 15 is substantially leveled with the upper surface of the adhesion increasing film 14c formed on the upper surface of the semiconductor constructing body 2. The insulating layer 15 is made of a material, usually called a prepreg material, which is obtained by impregnating a base material such as glass cloth, glass fibers, or aramid fibers with thermosetting resin such as epoxy-based resin, polyimide-based resin, or BT resin.

An upper insulating film 16 is formed to have a flat upper surface, on the upper surface of the adhesion increasing film 14c formed on the upper surface of the semiconductor constructing body 2, and on the upper surface of the insulating layer 15. The upper insulating film 16 is made of a material, usually called a buildup material for use in a buildup substrate, which is obtained by, e.g., dispersing a reinforcing material such as fibers or a filler in thermosetting resin such as epoxy-based resin, polyimide-based resin, or BT resin. Examples of the fibers are glass fibers and aramid fibers. Examples of the filler are a silica filler and ceramics-based filler.

Holes 17 are formed in those portions of the upper insulating film 16 and adhesion increasing film 14c, which correspond to the central portions of the upper surfaces of the columnar electrodes 12. Upper metal undercoatings 18 made of copper or the like are formed on the upper surface of the upper insulating film 16. Upper interconnections 19 made of copper are respectively formed on the entire upper surface of the upper metal undercoatings 18. One end portion of each upper interconnection 19 including the upper metal undercoating 18 is electrically connected to the upper surface of the columnar electrode 12 through the hole 17 in the upper insulating film 16 and adhesion increasing film 14c. The other end portion of each upper interconnection 19 constitutes a connecting pad portion.

An uppermost insulating film 20 made of a solder resist or the like is formed on the upper surface of the upper insulating film 16 and the upper interconnections 19. Holes 21 are formed in those portions of the uppermost insulating film 20, which correspond to the connecting pad portions of the upper interconnections 19. Solder balls 22 are formed in and above the holes 21 and electrically connected to the connecting pad portions of the upper interconnections 19. The solder balls 22 are arranged in a matrix on the uppermost insulating film 20.

A first lower insulating film 23 made of the same material as the insulating layer 15 is formed on the lower surface of the base plate 1. A second lower insulating film 24 made of the same material as the upper insulating film 16 is formed on the lower surface of the first lower insulating film 23. A lowermost insulating film 25 made of the same material as the uppermost insulating film 20 is formed on the lower surface of the second lower insulating film 24.

In this semiconductor device as described above, the adhesion increasing film 14a is formed between the semiconductor constructing body 2 and the insulating layer 15 to contact with the body 2 and layer 15, which covers the side surfaces of the semiconductor constructing body 2. This makes it possible to increase the adhesion between the silicon substrate 4 and the insulating layer 15 made of a prepreg material and covering the side surfaces of the silicon substrate 4. It is also possible to increase the adhesion between the sealing film 13 made of epoxy-based resin or the like and the insulating layer 15 made of a prepreg material and covering the side surfaces of the sealing film 13.

Consequently, it is possible to suppress peeling caused by thermal stress and/or mechanical stress between the silicon substrate 4 and the insulating layer 15 which covers the side surfaces of the silicon substrate 4. It is also possible to suppress peeling due to thermal stress and/or mechanical stress between the sealing film 13 and the insulating layer 15 which covers the side surfaces of the sealing film 13.

In addition, since the insulating layer 15 is formed on the upper surface of the base plate 1 via the adhesion increasing film 14b, the adhesion between the base plate 1 and the insulating layer 15 which covers the upper surface of the base plate 1 can be increased. As a consequence, it is possible to suppress peeling caused by thermal stress and/or mechanical stress between the base plate 1 and the insulating layer 15 which covers the upper surface of the base plate 1.

Furthermore, the upper insulating film 16 is formed on the upper surface of the semiconductor constructing body 2 via the adhesion increasing film 14c. This makes it possible to increase the adhesion between the sealing film 13 made of epoxy-based resin or the like and the upper insulating film 16 made of a buildup material and covering the upper surface of the sealing film 13. Consequently, it is possible to suppress peeling caused by thermal stress and/or mechanical stress between the sealing film 13 and the upper insulating film 16 which covers the upper surface of the sealing film 13.

In this semiconductor device, the size of the base plate 1 is made somewhat larger than that of the semiconductor constructing body 2, in order to make the size of the formation region or arranging region of the solder balls 22 somewhat larger than that of the semiconductor constructing body 2 in accordance with the increase in number of the connecting pads 5 on the silicon substrate 4, thereby making the size and pitch of the connecting pad portions (the portions in the holes 21 of the uppermost insulating film 20) of the upper interconnections 19 larger than those of the columnar electrodes 12.

Accordingly, those connecting pad portions of the upper interconnections 19, which are arranged in a matrix are formed not only in a region corresponding to the semiconductor constructing body 2, but also in a region corresponding to the insulating layer 15 formed outside the side surfaces of the semiconductor constructing body 2. That is, of the solder balls 22 arranged in a matrix, at least outermost solder balls 22 are formed in a periphery positioned outside the semiconductor constructing body 2.

Figure 2:
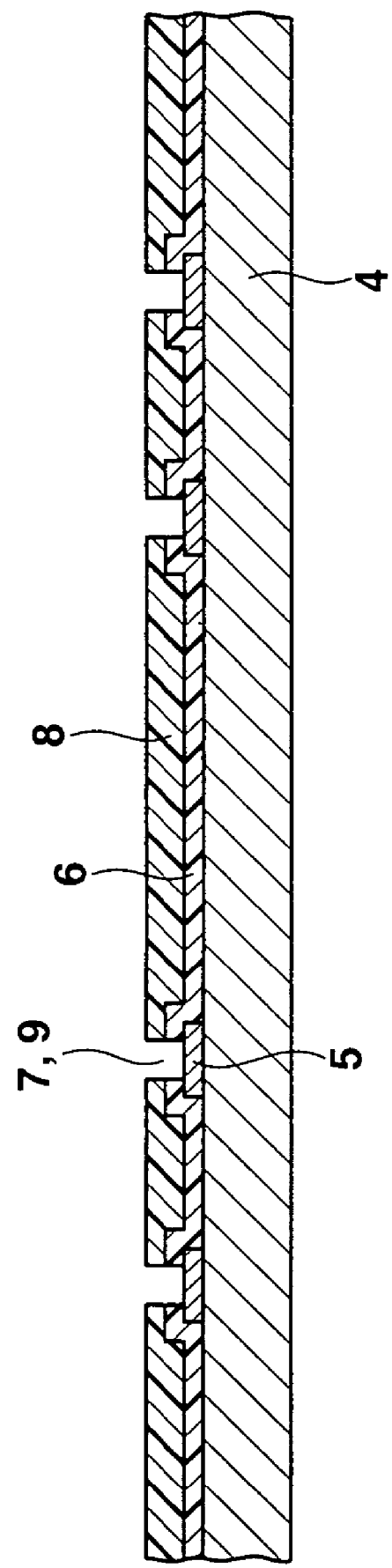
FIG. 2 is a sectional view of an initially prepared structure in an example of a method of fabricating the semiconductor device shown in FIG. 1.

An example of a method of fabricating this semiconductor device will be described below. First, an example of a method of fabricating the semiconductor constructing body 2 will be explained. In this method, an assembly as shown in FIG. 2 is first prepared. In this assembly, connecting pads 5 made of, e.g., an aluminum-based metal, an insulating film 6 made of, e.g., silicon oxide, and a protective film 8 made of, e.g., epoxy-based resin or polyimide-based resin are formed on a wafer-like silicon substrate (semiconductor substrate) 4. Central portions of the connecting pads 5 are exposed through holes 7 and 9 respectively formed in the insulating film 6 and protective film 8. In the wafer-like silicon substrate 4 having this structure, an integrated circuit having a predetermined function is formed in a region where each semiconductor constructing body is to be formed, and each connecting pads 5 are electrically connected to the integrated circuit formed in the corresponding region.

Figure 3:
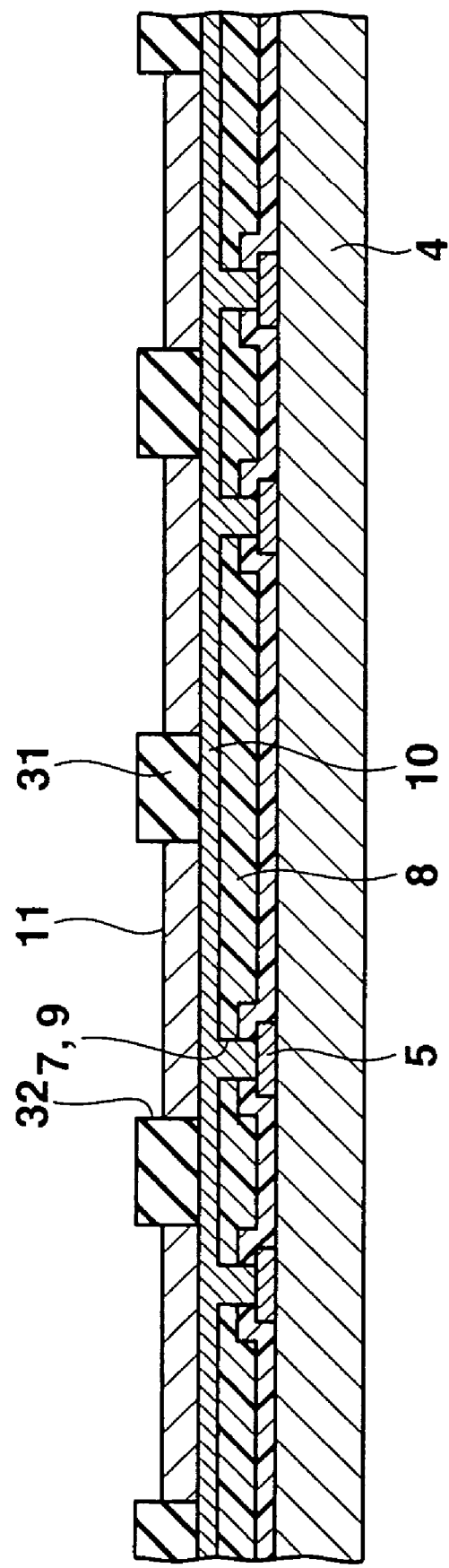
FIG. 3 is a sectional view of a step following FIG. 2.

As shown in FIG. 3, a metal undercoating 10 is formed on the entire upper surface of the protective film 8 and the upper surfaces of the connecting pads 5 exposed through the holes 7 and 9. The metal undercoating 10 may be any of a copper layer formed by electroless plating, a copper layer formed by sputtering, and a combination of a thin film of titanium or the like formed by sputtering and a copper layer formed on this thin film by sputtering.

A plating resist film 31 is formed by film-forming and then patterning, on the upper surface of the metal undercoating 10. Holes 32 which are formed in those portions of the plating resist film 31 correspond to regions where interconnections 11 are to be formed. Electroplating of copper is then performed by using the metal undercoating 10 as a plating current path to form interconnections 11 on the upper surface of the metal undercoating 10, in the holes 32 of the plating resist film 31. After that, the plating resist film 31 is removed.

Figure 4:
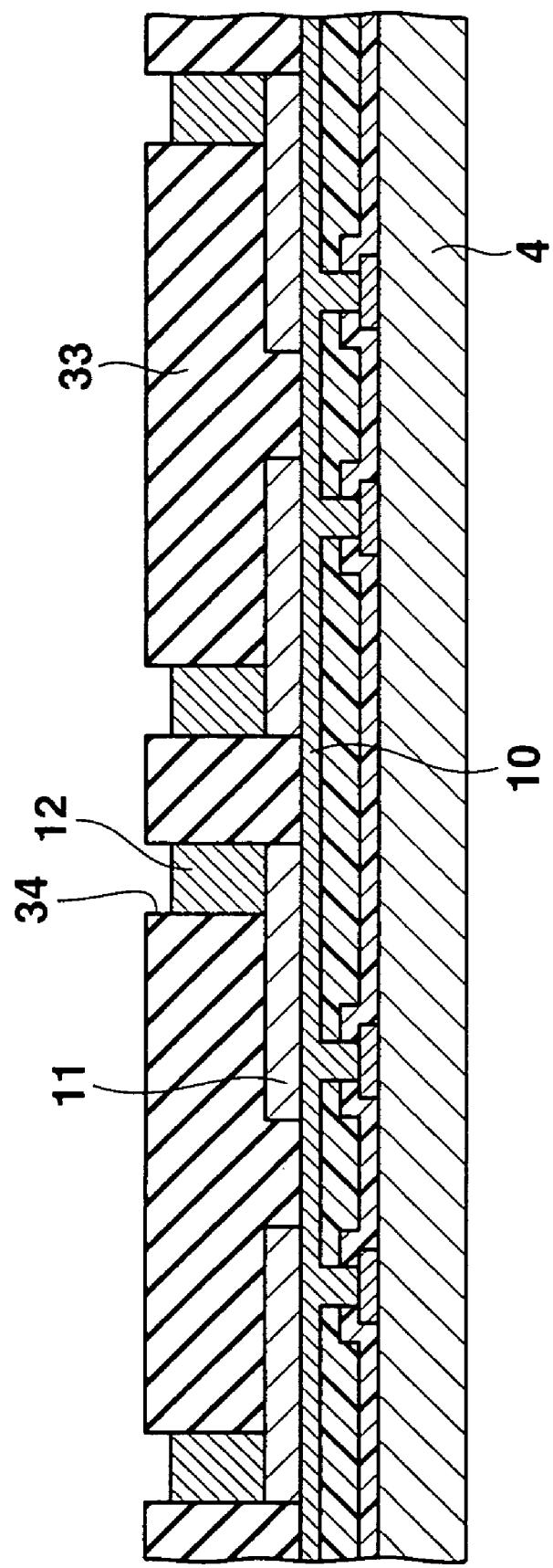
FIG. 4 is a sectional view of a step following FIG. 3.
Figure 5:
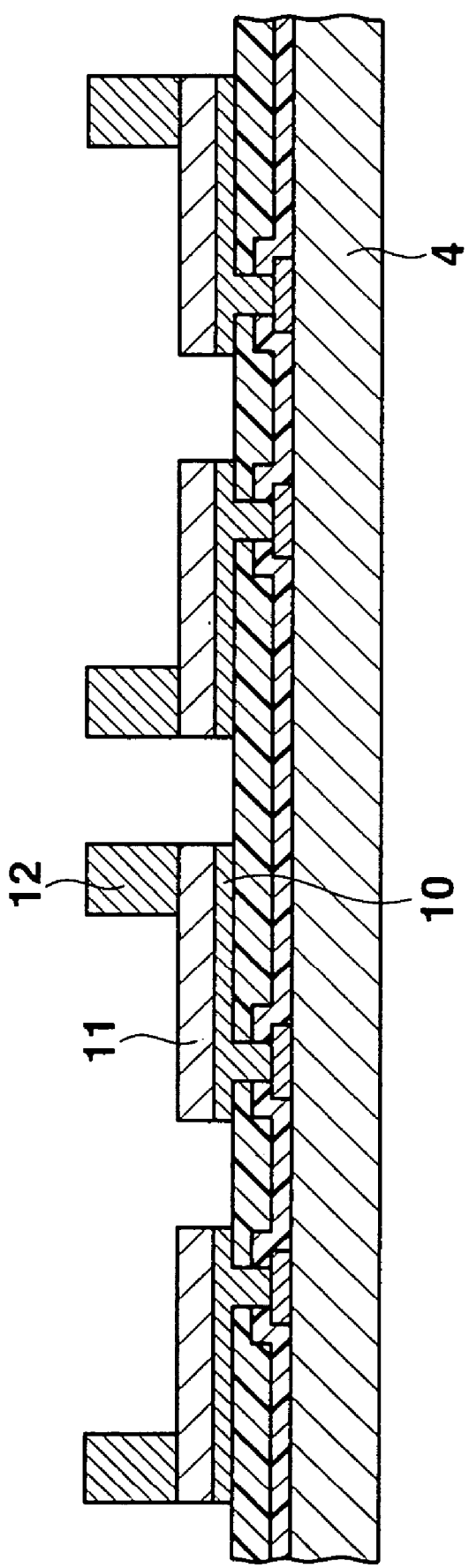
FIG. 5 is a sectional view of a step following FIG. 4.

As shown in FIG. 4, a plating resist film 33 is formed by film-forming and then patterning, on the upper surface of the metal undercoating 10 and the interconnections 11. Holes 34 which are formed in those portions of the plating resist film 33 correspond to regions where columnar electrodes 12 are to be formed. Electroplating of copper is then performed by using the metal undercoating 10 as a plating current path to form columnar electrodes 12 on the upper surfaces of connecting pad portions of the interconnections 11 in the holes 34 of the plating resist film 33. After that, the plating resist film 33 is removed, and unnecessary portions of the metal undercoating 10 are etched away by using the interconnections 11 as masks. Consequently, as shown in FIG. 5, the metal undercoating 10 remains only below the interconnections 11.

Figure 6:
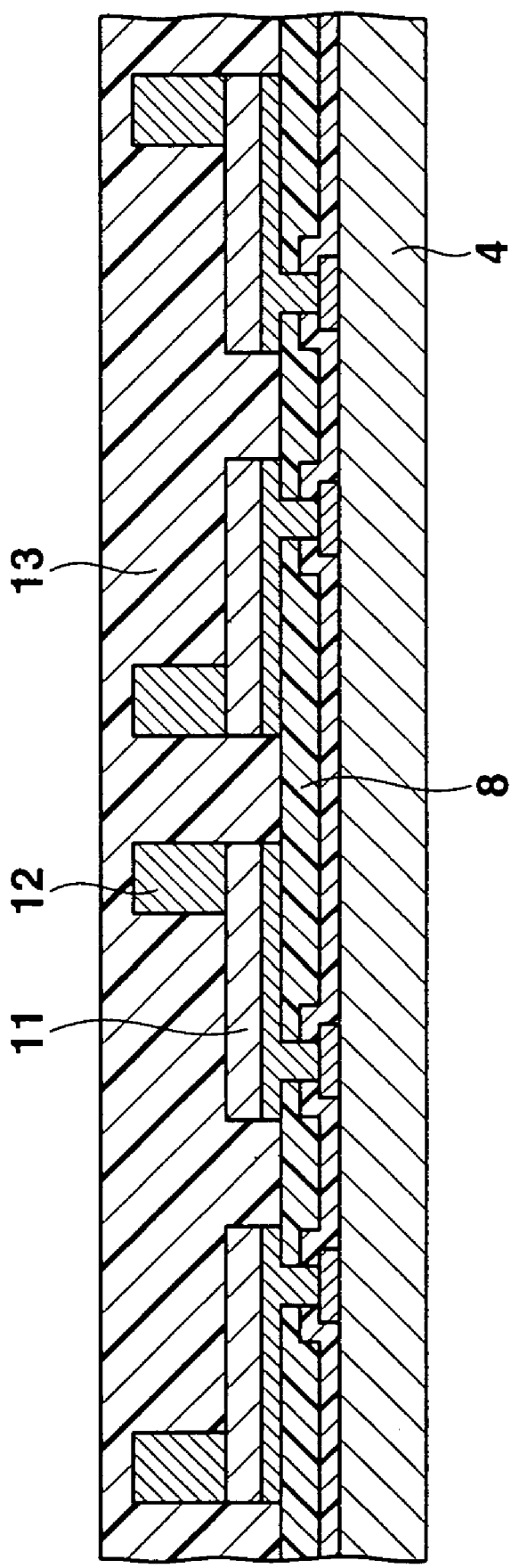
FIG. 6 is a sectional view of a step following FIG. 5.

As shown in FIG. 6, a sealing film 13 made of, e.g., epoxy-based resin or polyimide-based resin is formed on the entire upper surface of the protective film 8, the columnar electrodes 12 and interconnections 11 by, e.g., screen printing, spin coating, or die coating, such that the thickness of the sealing film 13 is larger than the height of the columnar electrodes 12. In this state, therefore, the upper surfaces of the columnar electrodes 12 are covered with the sealing film 13.

Figure 7:
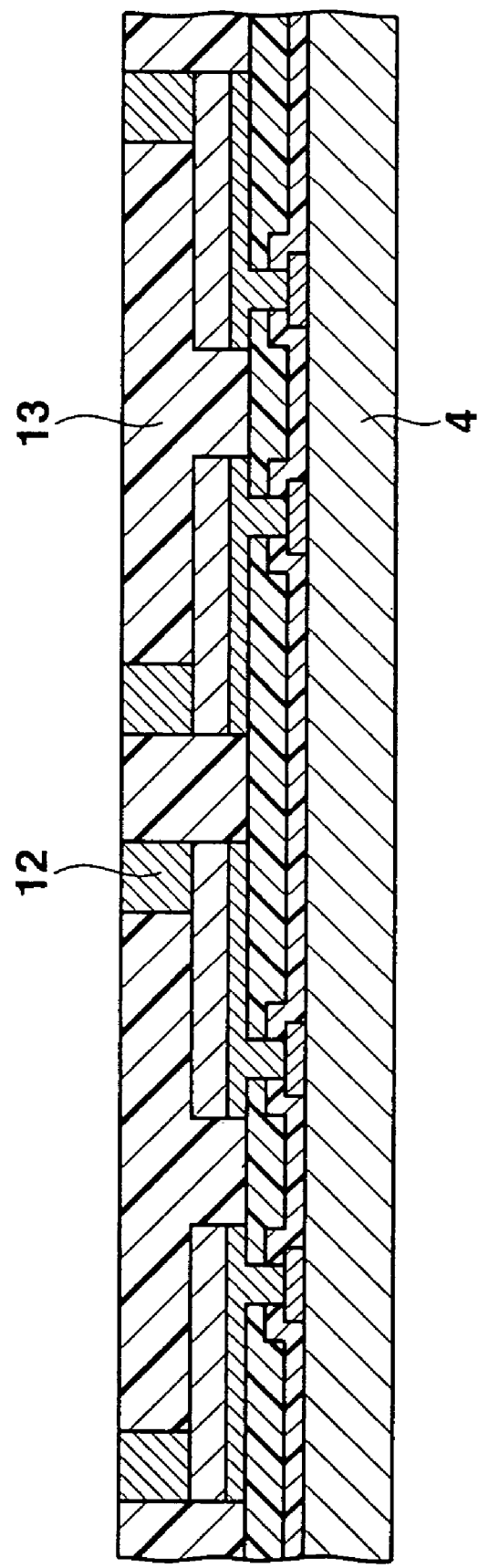
FIG. 7 is a sectional view of a step following FIG. 6.

As shown in FIG. 7, the sealing film 13 and the upper surfaces of the columnar electrodes 12 are properly polished to expose the upper surfaces of the columnar electrodes 12, and planarize the upper surface of the sealing film 13 including those exposed upper surfaces of the columnar electrodes 12. The upper surfaces of the columnar electrodes 12 are thus properly polished in order to make the heights of the columnar electrodes 12 uniform by eliminating variations in height of the columnar electrodes 12 formed by electroplating.

Figure 8:
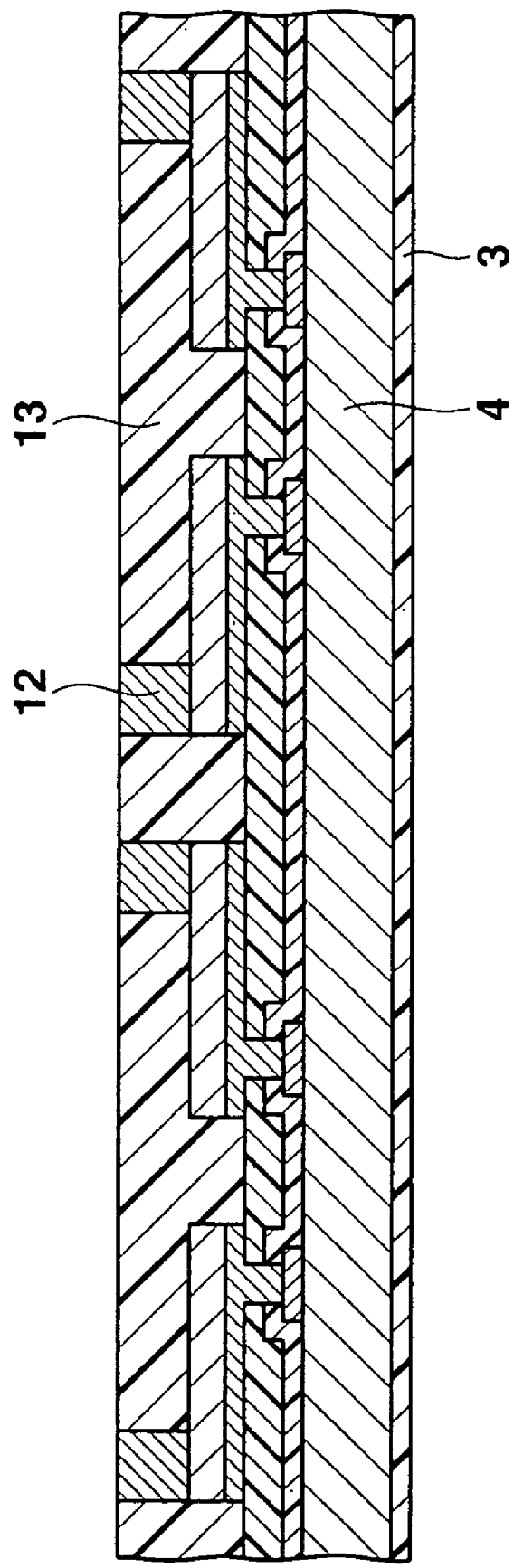
FIG. 8 is a sectional view of a step following FIG. 7.
Figure 9:
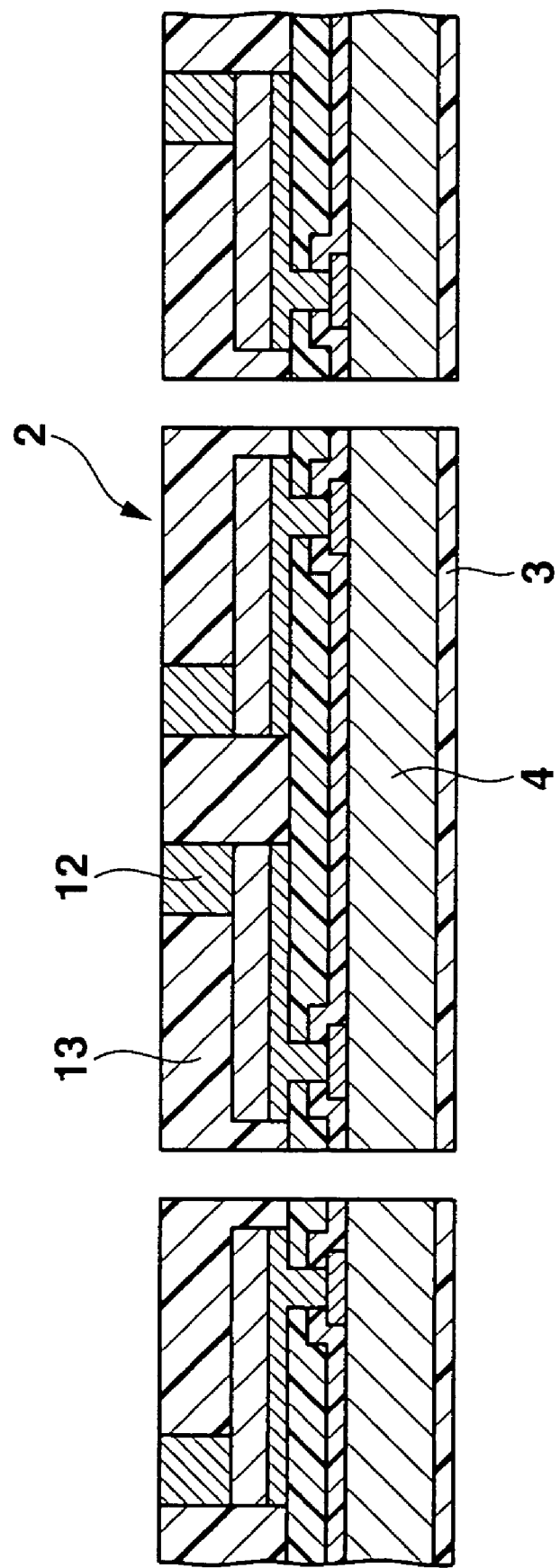
FIG. 9 is a sectional view of a step following FIG. 8.

As shown in FIG. 8, an adhesive layer 3 is adhered to the entire lower surface of the silicon wafer 4. The adhesive layer 3 is made of a die bonding material, such as epoxy-based resin or polyimide-based resin, which is commercially available as a die attachment film. The adhesive layer 3 is fixed in a semi-cured state to the silicon wafer 4 by heating and pressing. Then, the adhesive layer 3 fixed to the silicon wafer 4 is adhered to a dicing tape (not shown), and removed from the dicing tape after a dicing step shown in FIG. 9 is performed. Consequently, a plurality of semiconductor constructing bodies 2 each having the adhesive layer 3 on the lower surface of the silicon substrate 4 are obtained.

Figure 10:
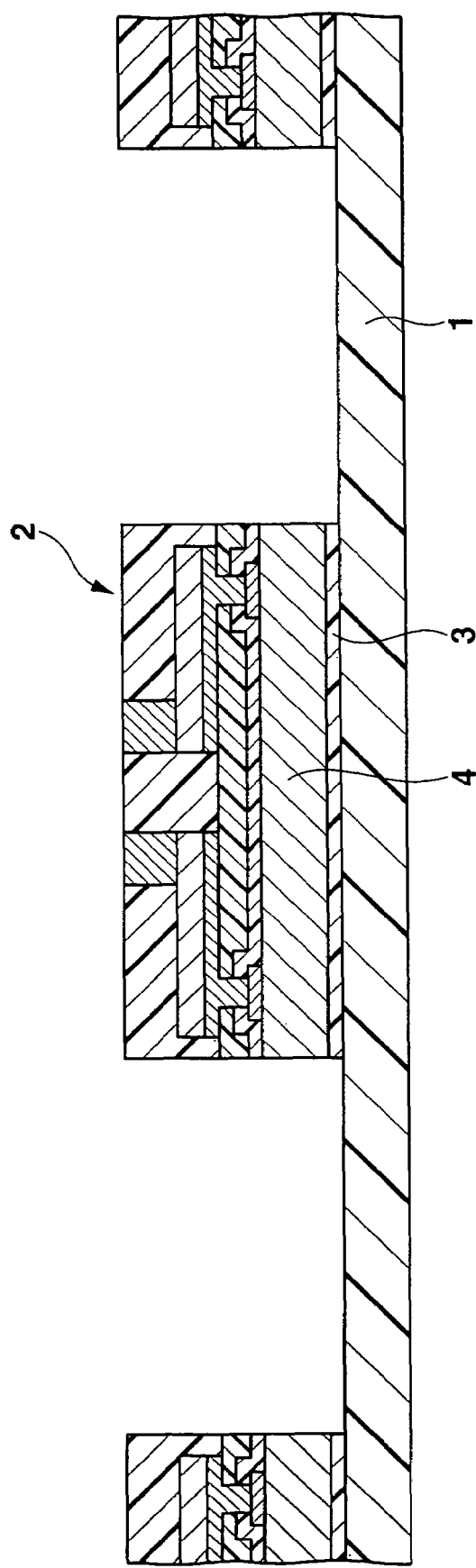
FIG. 10 is a sectional view of a step following FIG. 9.

An example of a method of fabricating the semiconductor device shown in FIG. 1 by using the semiconductor constructing body 2 thus obtained will be described below. First, as shown in FIG. 10, a base plate 1 having an area capable of forming a plurality of completed semiconductor devices shown in FIG. 1 is prepared. The base plate 1 has, e.g., a square planar shape, although the shape is not particularly limited. The base plate 1 is a sheet-like material obtained by impregnating a base material made of glass cloth or the like with thermosetting resin such as epoxy-based resin, and setting the thermosetting resin.

Figure 11:
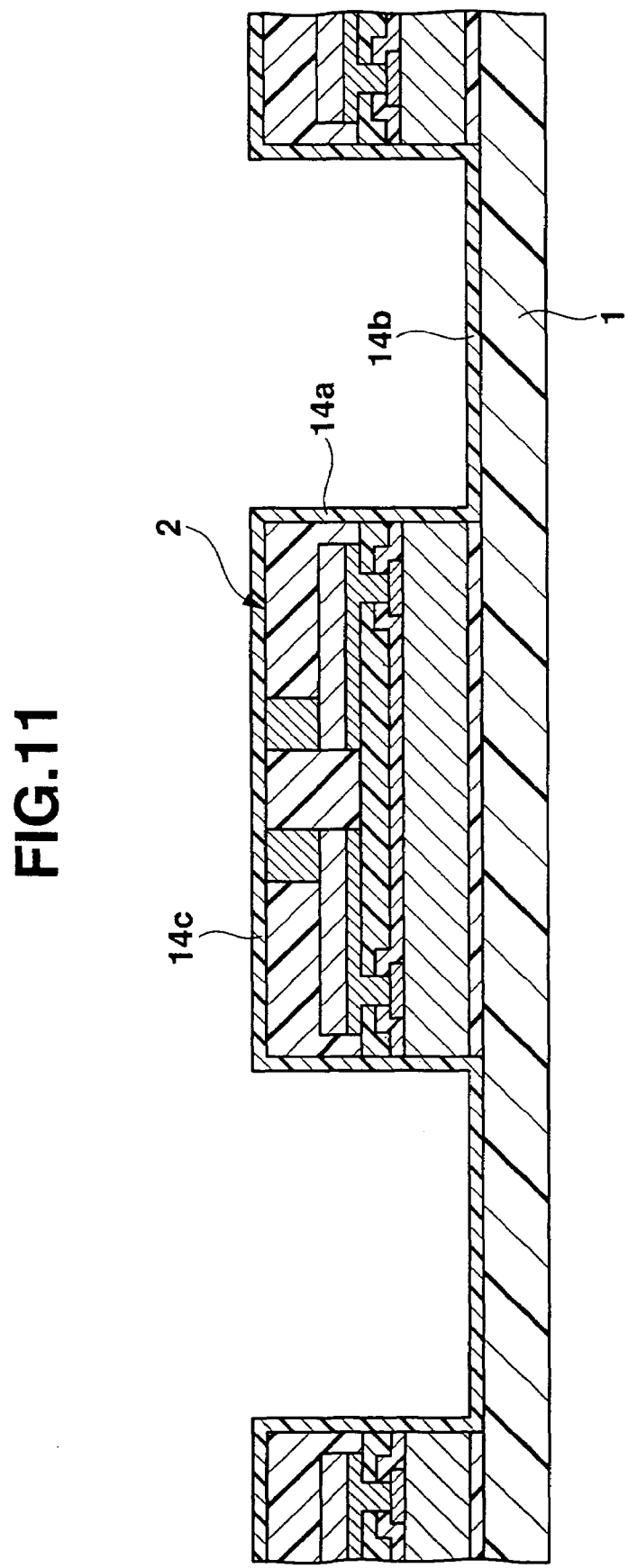
FIG. 11 is a sectional view of a step following FIG. 10.

Then, the adhesive layers 3 adhered to the lower surfaces of the silicon substrates 4 of the semiconductor constructing bodies 2 are adhered to a plurality of predetermined portions on the upper surface of the base plate 1. In this adhesion, the adhesive layers 3 are finally cured by heating and pressing. As shown in FIG. 11, adhesion increasing films 14a, 14b, and 14c made of a silane coupling agent are continuously formed on the side surfaces of each semiconductor constructing body 2, on the upper surface of the base plate 1 around each semiconductor constructing body 2, and on the upper surface of each semiconductor constructing body 2, respectively.

The adhesion increasing films 14a, 14b, and 14c can be simultaneously formed by any of, e.g., screen printing, gravure printing, spray printing, letterpress printing, inkjet printing, spin coating, die coating, slit coating, mesh coating, dip coating, and CVD (Chemical Vapor Deposition). The silane coupling agent can be either a stock solution or a solution diluted by, e.g., an organic solvent (preferably an alcohol-based solvent) or water.

Examples of the silane coupling agent are γ-(2-aminoethyl)aminopropylmethoxysilane, γ-(2-aminoethyl)aminopropylethoxysilane, γ-(2-aminoethyl)aminopropylmethyldimethoxysilane, aminosilane, γ-methacryloxypropyltrimethoxysilane, γ-methacryloxypropylmethyldimethoxysilane, γ-methacryloxypropyltriethoxysilane, γ-glycidoxypropyltrimethoxysilane, γ-glycidoxypropylmethyldiethoxysilane, γ-methacryloxypropylmethyldiethoxysilane, γ-glycidoxypropyltriethoxysilane, γ-mercaptopropyltrimethoxysilane, methyltrimethoxysilane, methyltriethoxysilane, vinyltriacetoxysilane, hexamethyldisilazane, γ-anilinopropyltrimethoxysilane, vinyltrimethoxysilane, vinyltriethoxysilane, γ-mercaptopropylmethyldimethoxysilane, methyltrichlorosilane, dimethyldichlorosilane, trimethylchlorosilane, vinyltrichlorosilane, vinyltriethoxysilane, vinyltris(β-methoxyethoxy)silane, β-(3,4-epoxycyclohexyl)ethyltrimethoxysilane, p-styryltrimethoxysilane, γ-acryloxypropyltrimethoxysilane, γ-aminopropyltrimethoxysilane, γ-aminopropyltriethoxysilane, γ-triethoxysilyl-N-(1,3-dimethyl-butylidene)propylamine, N-phenyl-3-aminopropyltrimethoxysilane, γ-ureidopropyltriethoxysilane, γ-chloropropyltrimethoxysilane, γ-mercaptopropyltrimethoxysilane, bis(triethoxysilylpropyl)tetrasulfide, and γ-isocyanatopropyltriethoxysilane. It is possible to use any material having $(C_nH_{2n+1}O)_m$—Si— (where n, m=1, 2, 3) in a molecule.

Figure 12:
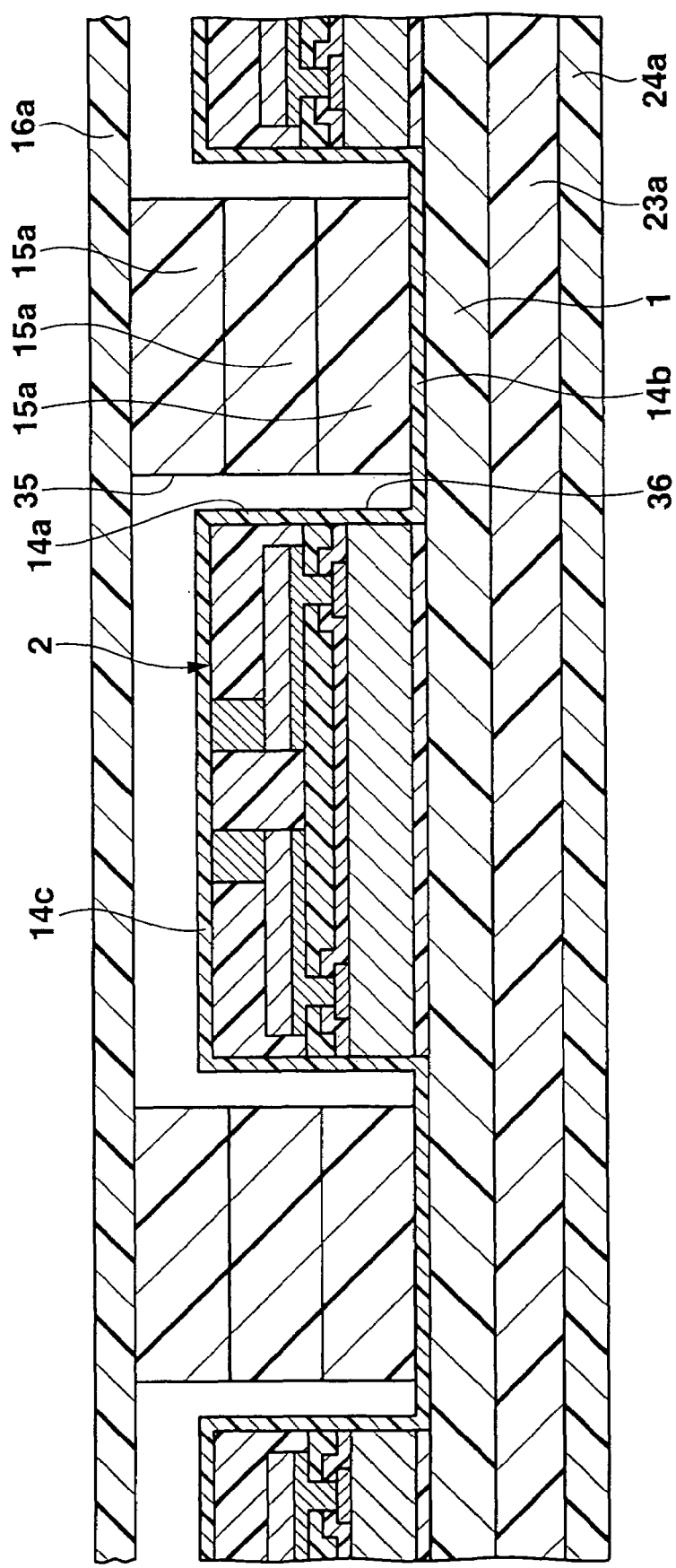
FIG. 12 is a sectional view of a step following FIG. 11.

Then, as shown in FIG. 12, three lattice-like insulating layer formation sheets 15a are stacked, as they are positioned by pins or the like (not shown), on the upper surface of the adhesion increasing film 14b formed on the upper surface of the base plate 1 around the adhesion increasing film 14a formed on the side surfaces of the semiconductor constructing body 2. Also, an upper insulating film formation sheet 16a is placed on the upper surfaces of the upper-most insulating layer formation sheets 15a. In addition, a first lower insulating film formation sheet 23a made of the same material as the insulating layer formation sheet 15a and a second lower insulating film formation sheet 24a made of the same material as the upper insulating film formation sheet 16a are stacked on the lower surface of the base plate 1 one by one.

The lattice-like insulating layer formation sheet 15a is obtained by forming a plurality of square holes 35 in a prepreg material by punching, drilling, or router processing. The prepreg material is a sheet-like material obtained by impregnating a base material made of glass cloth or the like with thermosetting resin such as epoxy-based resin, and setting the thermosetting resin in a semi-cured state (B stage). The upper insulating film formation sheet 16a is preferably made of a sheet-like buildup material, although the material is not particularly limited. This buildup material is obtained by, e.g., mixing a silica filler in thermosetting resin such as epoxy-based resin, and setting the thermosetting resin in a semi-cured state.

The size of the hole 35 in the insulating layer formation sheet 15a is slightly larger than that of the semiconductor constructing body 2. Accordingly, a gap 36 is formed between the insulating layer formation sheet 15a and the adhesion increasing film 14a formed on the side surfaces of the semiconductor constructing body 2. Also, the total thickness of the three insulating layer formation sheets 15a is somewhat larger than the thickness of the semiconductor constructing body 2 including the adhesion increasing film 14c, and, as will be described later, is large enough to fill the gap 36 when heating and pressing are performed.

Although all insulating layer formation sheets 15a have the same thickness in this embodiment, they or some of them may also have different thicknesses. Also, the number of the insulating layer formation sheets 15a can be three as described above, but it may also be one or four or more. Note that, the thickness of the upper insulating film formation sheet 16a is equal to or slightly larger than that of an upper insulating film 16 (FIG. 1) to be formed.

Figure 13:
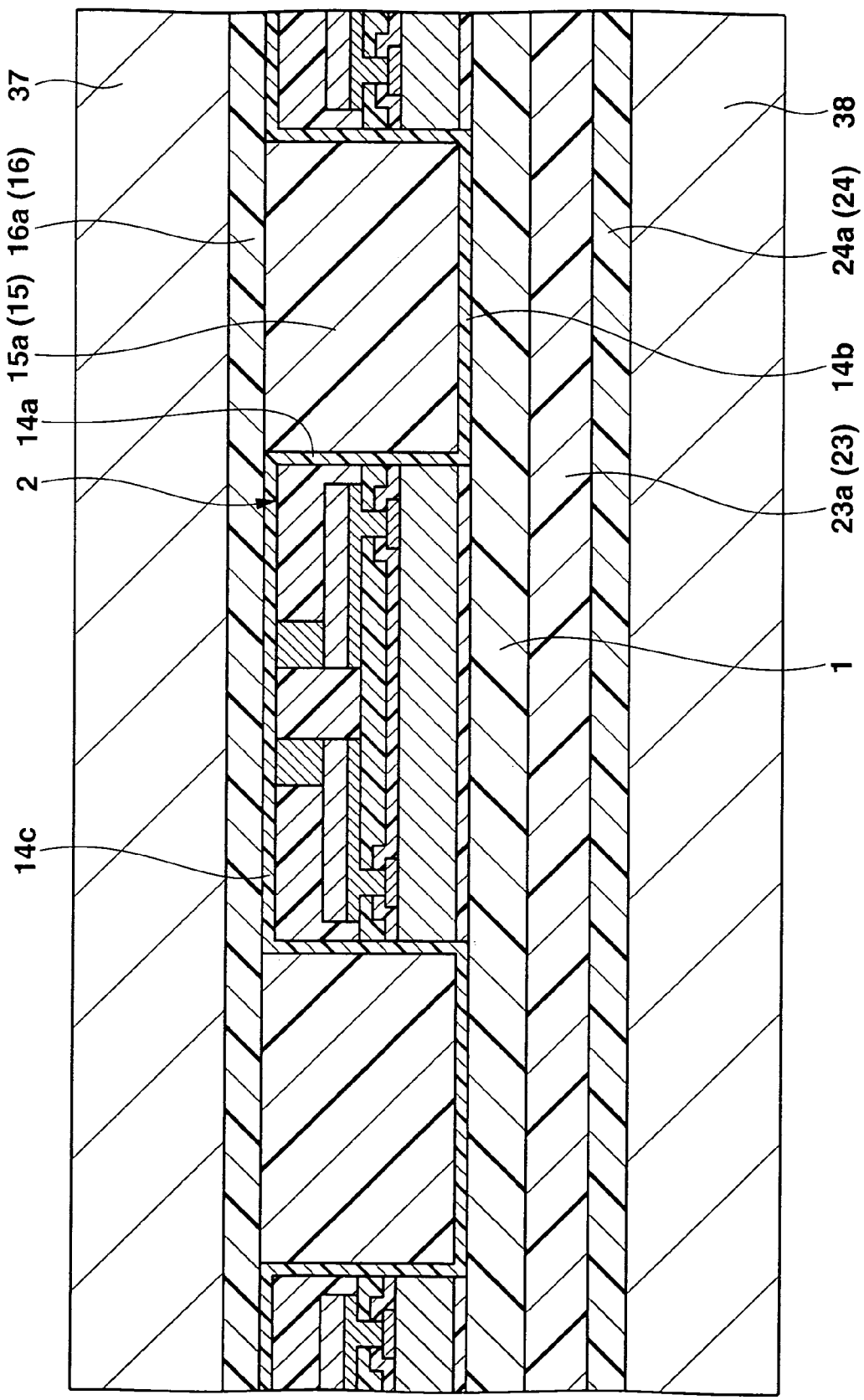
FIG. 13 is a sectional view of a step following FIG. 12.

As shown in FIG. 13, a pair of heating/pressing plates 37 and 38 are used to heat and press, from above and below, the insulating layer formation sheets 15a, upper insulating film formation sheet 16a, first lower insulating film formation sheet 23a, and second lower insulating film formation sheet 24a. Consequently, the molten thermosetting resin in the insulating layer formation sheets 15a is pushed outside and filled in the gap shown in FIG. 12. When cooling is performed after that, an insulating layer 15 is formed on the upper surface of the adhesion increasing film 14b formed on the upper surface of the base plate 1 to contact with the adhesion increasing film 14a formed on the side surfaces of the semiconductor constructing body 2.

Simultaneously, an upper insulating film 16 is formed on the upper surface of the adhesion increasing film 14c formed on the upper surface of the semiconductor constructing body 2, and on the upper surface of the insulating layer 15. In addition, a first lower insulating film 23 and second lower insulating film 24 are simultaneously formed on the lower surface of the base plate 1. The first lower insulating film formation sheet 23a and insulating layer formation sheets 15a may be made of the same material, and have the same thermal expansion coefficient. Also, the second lower insulating film formation sheet 24a and upper insulating film formation sheet 16a are preferably made of the same material, and have the same thermal expansion coefficient.

Consequently, in the region of the insulating layer 15, the vertical material arrangement is substantially symmetrical with respect to the base plate 1. Therefore, when heating and pressing are performed, the insulating layer formation sheets 15a and upper insulating film formation sheet 16a above the base plate 1 and the first lower insulating film formation sheet 23a and second lower insulating film formation sheet 24a below the base plate 1 cure and shrink substantially symmetrically in the vertical direction in the region of the insulating layer 15, thereby reducing the warpage of the base plate 1. This allows easy transfer to the subsequent steps, and achieves high processing accuracy in the subsequent steps. This similarly applies to a lowermost insulating film formation sheet 25a (to be described later).

Also, the upper surface of the upper insulating film 16 is a flat surface because it is pressed by the lower surface of the upper heating/pressing plate 37. Likewise, the lower surface of the second lower insulating film 24 is a flat surface because it is pressed by the upper surface of the lower heating/pressing plate 38. Accordingly, no polishing steps of planarizing the upper surface of the upper insulting film 16 and the lower surface of the second lower insulating film 24 are necessary.

Figure 14:
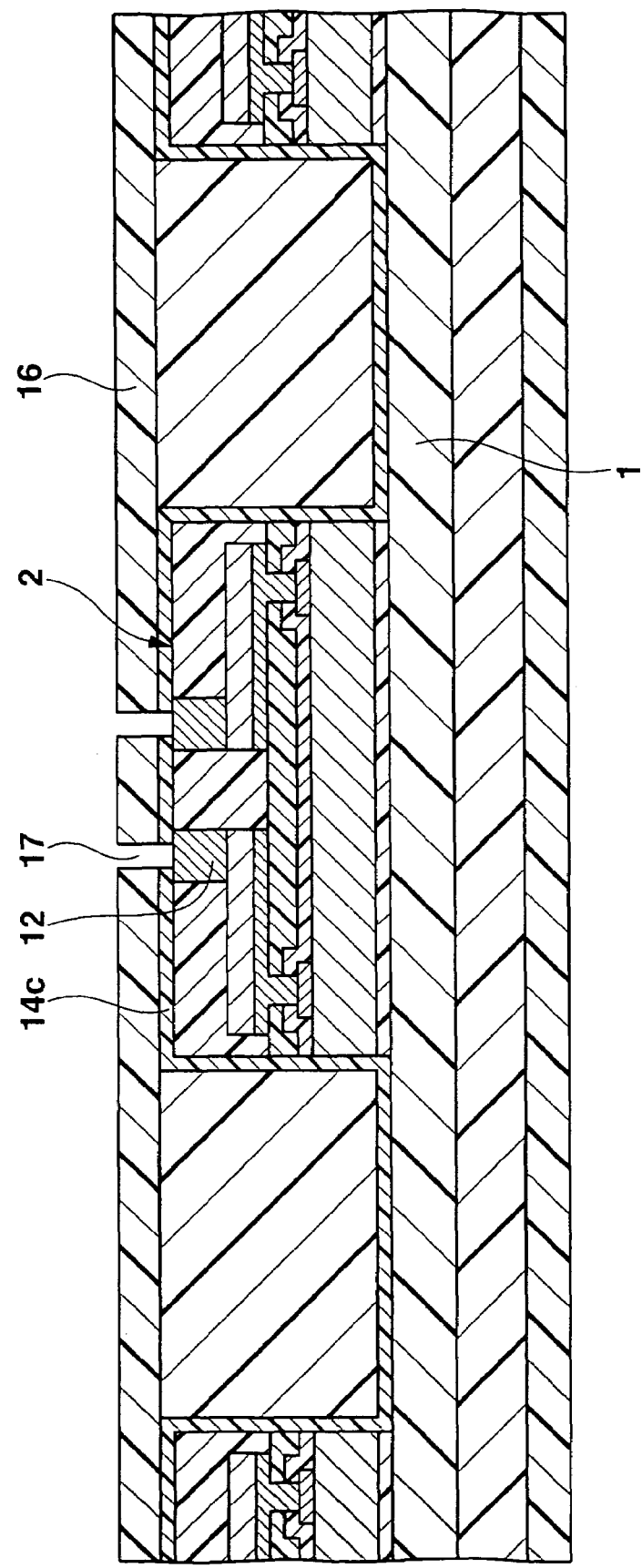
FIG. 14 is a sectional view of a step following FIG. 13.

Next, as shown in FIG. 14, laser processing which radiates a laser beam is used to form holes 17 in those portions of the upper insulating film 16 and adhesion increasing film 14c, which correspond to the central portions of the upper surfaces of the columnar electrodes 12. Then, if necessary, epoxy smear and the like occurring in the holes 17 and the like are removed by a desmear process.

Figure 15:
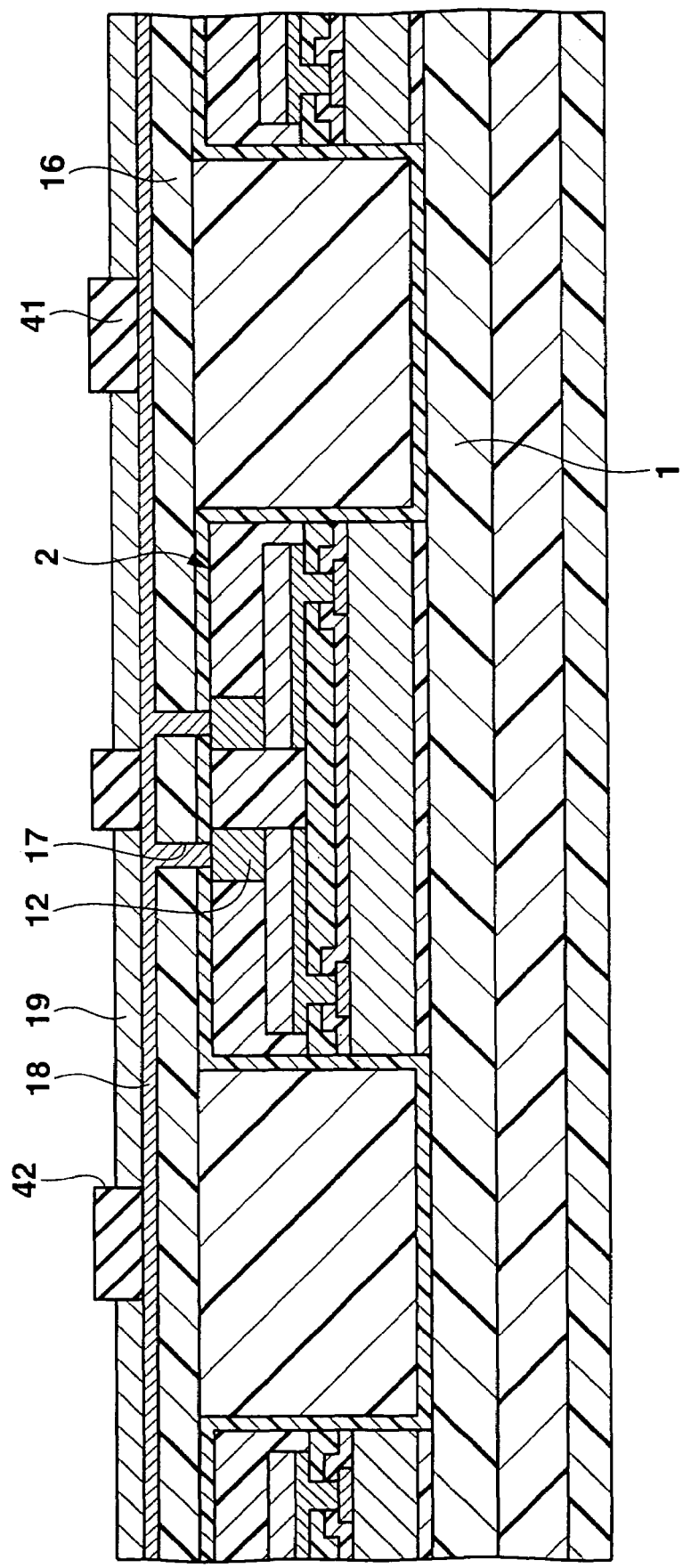
FIG. 15 is a sectional view of a step following FIG. 14.

As shown in FIG. 15, an upper metal undercoating (undercoating formation layer) 18 is formed by electroless plating of copper on the entire upper surface of the upper insulating film 16 and the upper surfaces of the columnar electrodes 12 exposed through the holes 17. A plating resist film 41 is then formed by layer-forming and then patterning on the upper surface of the upper metal undercoating 18. Holes 42 are formed in those portions of the plating resist film 41, which correspond to formation regions of upper interconnections 19.

Figure 16:
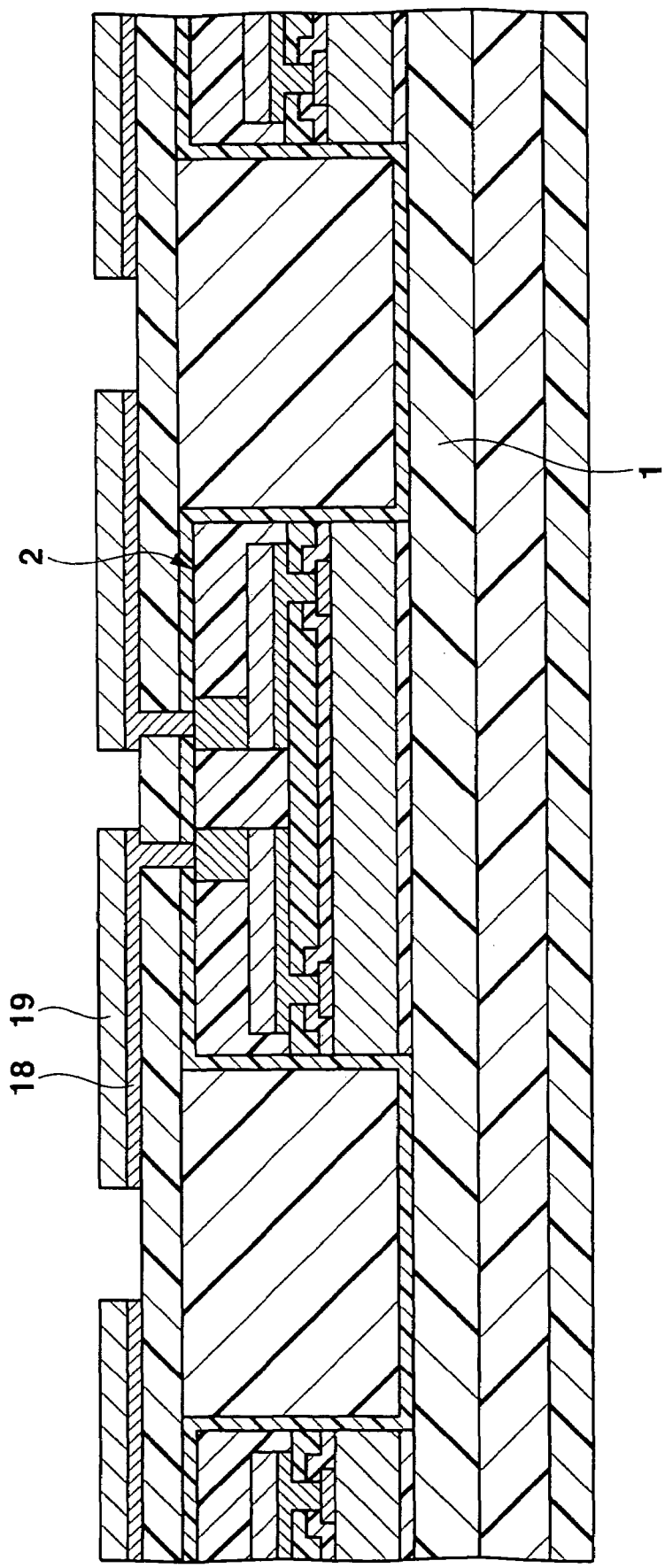
FIG. 16 is a sectional view of a step following FIG. 15.

Electroplating of copper is then performed by using the upper metal undercoating 18 as a plating current path, thereby forming upper interconnections 19 on the upper surface of the upper metal undercoating (formation layer) 18 in the holes 42 of the plating resist film 41. After that, the plating resist film 41 is removed, and unnecessary portions of the upper metal undercoating 18 are etched away by using the upper interconnections 19 as masks. Consequently, as shown in FIG. 16, the upper metal undercoatings 18 remain only below the upper interconnections 19.

Figure 17:
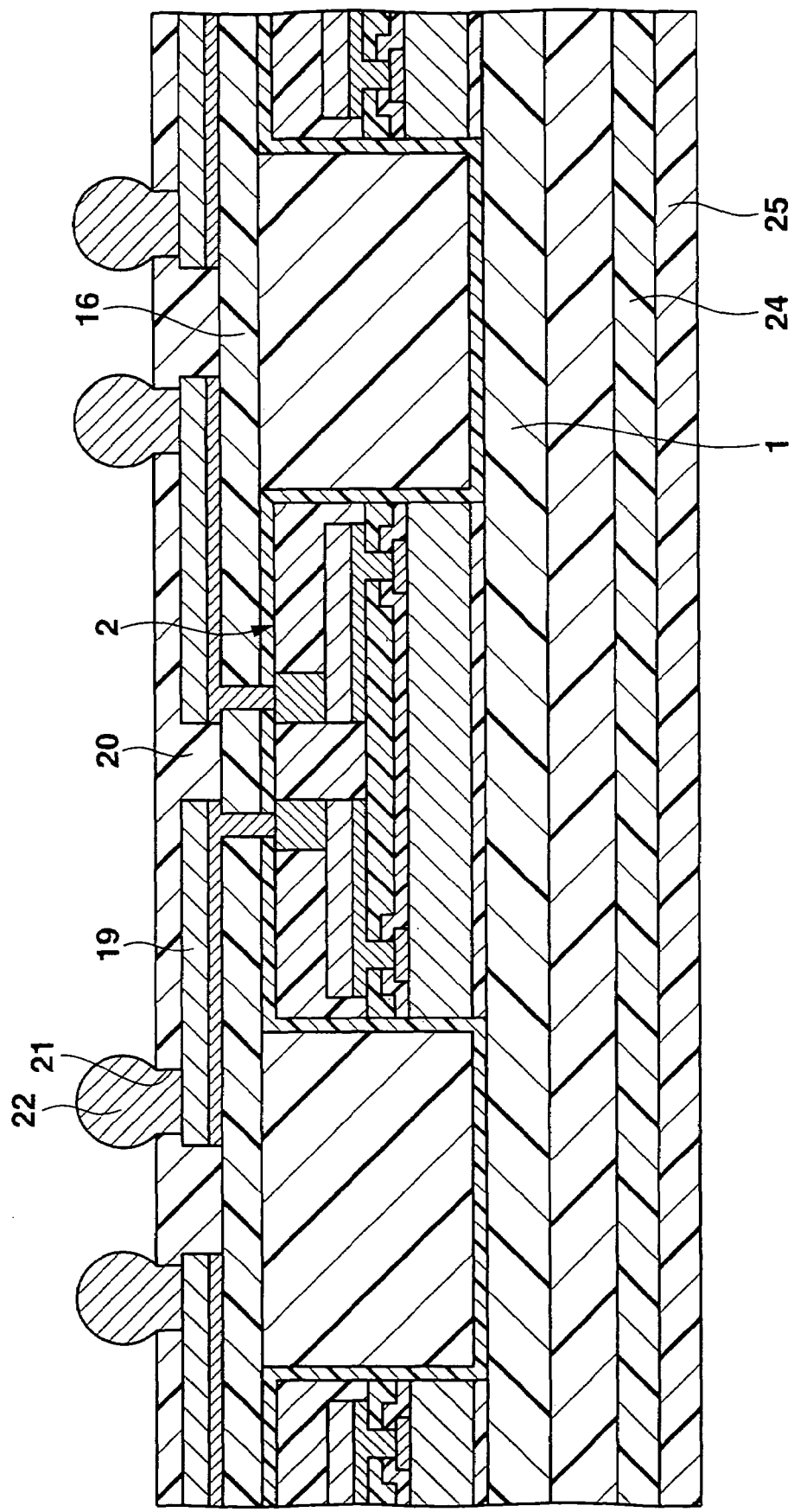
FIG. 17 is a sectional view of a step following FIG. 16.

As shown in FIG. 17, an uppermost insulating film 20 made of a solder resist or the like is formed on the upper surface of the upper insulating film 16 and the upper interconnections 19 by, e.g., screen printing or spin coating. In addition, a lowermost insulating film 25 made of the same material as the uppermost insulating film 20 is formed on the lower surface of the second lower insulating film 24. Holes 21 are formed in those portions of the uppermost insulating film 20, which correspond to connecting pad portions of the upper interconnections 19. Solder balls 22 are then formed in and above the holes 21 to upwardly extend therefrom and electrically and mechanically connected to the connecting pad portions of the upper interconnections 19.

Figure 18:
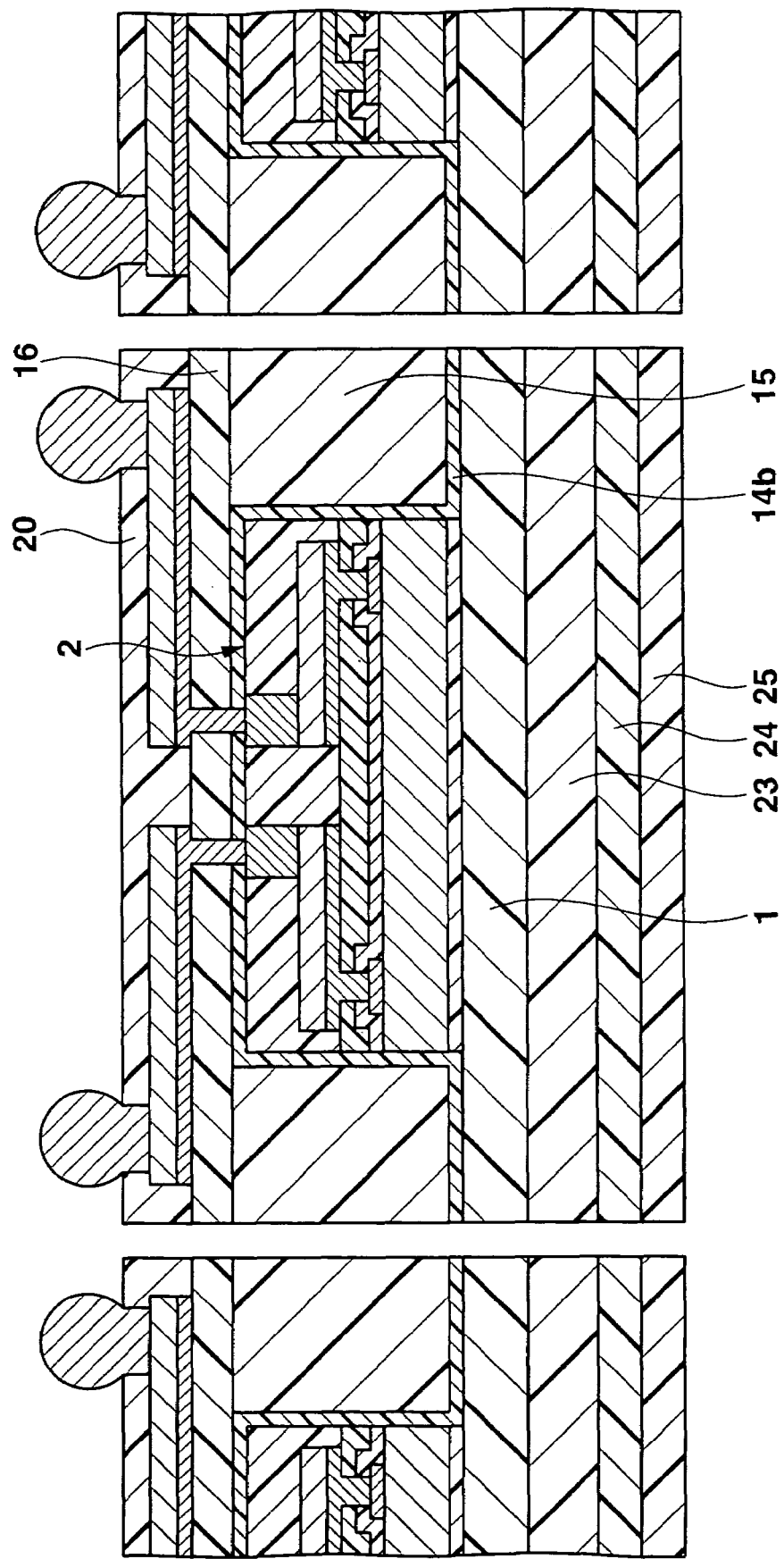
FIG. 18 is a sectional view of a step following FIG. 17.

Finally, as shown in FIG. 18, the uppermost insulating film 20, upper insulating film 16, insulating layer 15, adhesion increasing film 14b, base plate 1, first lower insulating film 23, second lower insulating film 24, and lowermost insulating film 25 are cut between the semiconductor constructing bodies 2 adjacent to each other, thereby obtaining a plurality of semiconductor devices each shown in FIG. 1.

In this fabrication method as described above, the plurality of semiconductor constructing bodies 2 are arranged on the common base plate 1 via the adhesive layers 3, and the upper interconnections 19 and solder balls 22 are collectively formed for the plurality of semiconductor constructing bodies 2. Since a plurality of semiconductor devices are obtained by cutting after that, the fabrication process can be simplified. Also, from the fabrication step shown in FIG. 13, the plurality of semiconductor constructing bodies 2 can be transferred together with the base plate 1. This also simplifies the fabrication process.

Figure 19:
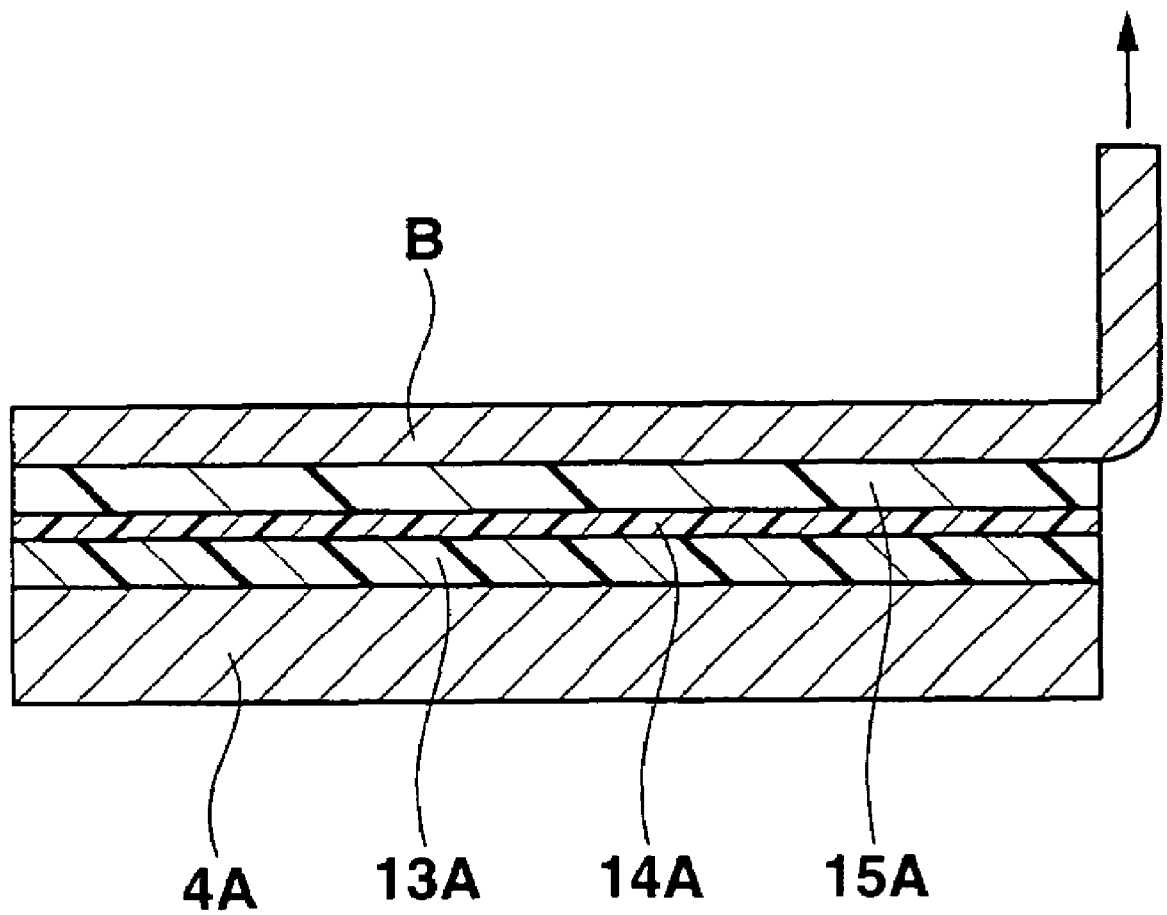
FIG. 19 is a view for explaining an example of a peel strength test.

An example of a peel strength test will be explained below. First, as shown in FIG. 19, a sealing film 13A made of epoxy-based resin was formed on the upper surface of a silicon substrate 4A, and preprocessing (degreasing+hot water washing+cold water washing) was performed on the upper surface of the sealing film 13A. An adhesion increasing film 14A made of a silane coupling agent was formed on the upper surface of the sealing film 13A, and an insulating layer 15A made of a prepreg material containing epoxy-based resin was formed on the upper surface of the adhesion increasing film 14A. One end portion of a copper layer B formed on the upper surface of the insulating layer 15A was pulled at an angle of 90° with respect to the upper surface of the insulating layer 15A as shown by an arrow.

Samples prepared in this test were a sample (to be referred to as present sample 1 hereinafter) in which the copper layer B was a copper foil laminated on the upper surface of the insulating layer 15A, and a sample (to be referred to as present sample 2 hereinafter) in which the copper layer B was a copper plating layer formed on the supper surface of the insulating layer 15A. Also, with reference to FIG. 19, samples for comparison were prepared by forming the insulating layer 15A and copper layer B directly on the upper surface of the sealing film 13A without forming any adhesion increasing layer 14A. The copper layer B was made of a copper foil in one sample (to be referred to as comparative sample 1 hereinafter), and was a copper plating layer in the other sample (to be referred to as comparative sample 2 hereinafter).

The silane coupling agents used in present samples 1 and 2 were materials diluted by isopropylalcohol or water, in which the concentration of 3-glydoxypropyltriethoxysilane was 1.0 wt %, and the concentration of N-3(aminoethyl)3-aminopropyltrimethoxysilane was 1.0 wt %.

When peel strength tests were conducted, peeling occurred between the insulating layer 15A and sealing film 13A in each of comparative samples 1 and 2. Since, however, the peel strength (kN/m) when peeling occurred was 0, practically no measurements could be performed. By contrast, in each of present samples 1 and 2, no peeling occurred between the insulating layer 15A and sealing film 13A, and peeling occurred between the copper layer B and insulating layer 15A, regardless of the type of silane coupling agent. The peel strength (kN/m) when peeling occurred was 0.8 or more. Accordingly, when the adhesion increasing film 14A was formed between the sealing film 13A and insulating layer 15A, it was possible to suppress pealing caused by thermal stress or mechanical stress between the sealing film 13A and insulating layer 15A.

Second Embodiment

Figure 20:
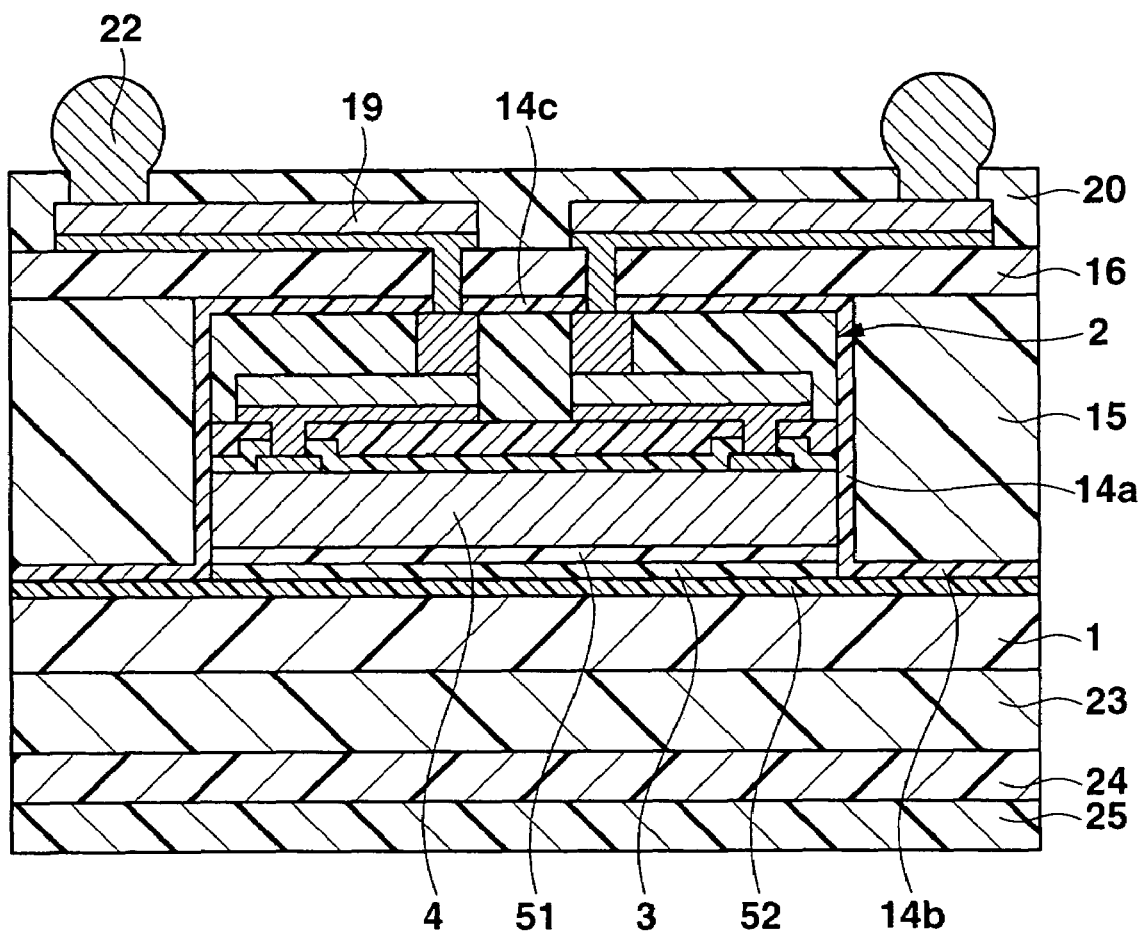
FIG. 20 is a sectional view of a semiconductor device as the second embodiment of the present invention.

FIG. 20 is a sectional view of a semiconductor device as the second embodiment of the present invention. This semiconductor device basically differs from the semiconductor device shown in FIG. 1 in that an adhesive layer 3 adhered to the lower surface of an adhesion increasing film 51 formed by using a silane coupling agent on the lower surface of a silicon substrate 4 of a semiconductor constructing body 2 is adhered to the upper surface of an adhesion increasing film 52 formed by using a silane coupling agent on the upper surface of a base plate 1.

Figure 21:
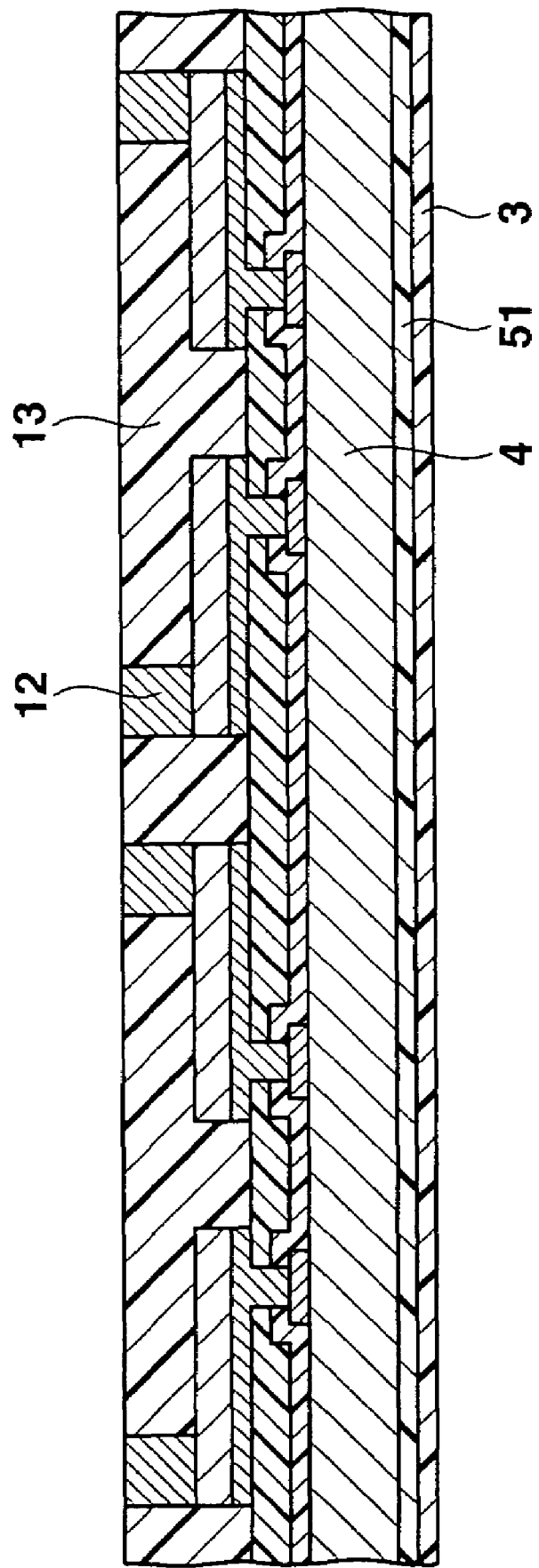
FIG. 21 is a sectional view of a predetermined step when the semiconductor device shown in FIG. 20 is fabricated.
Figure 22:
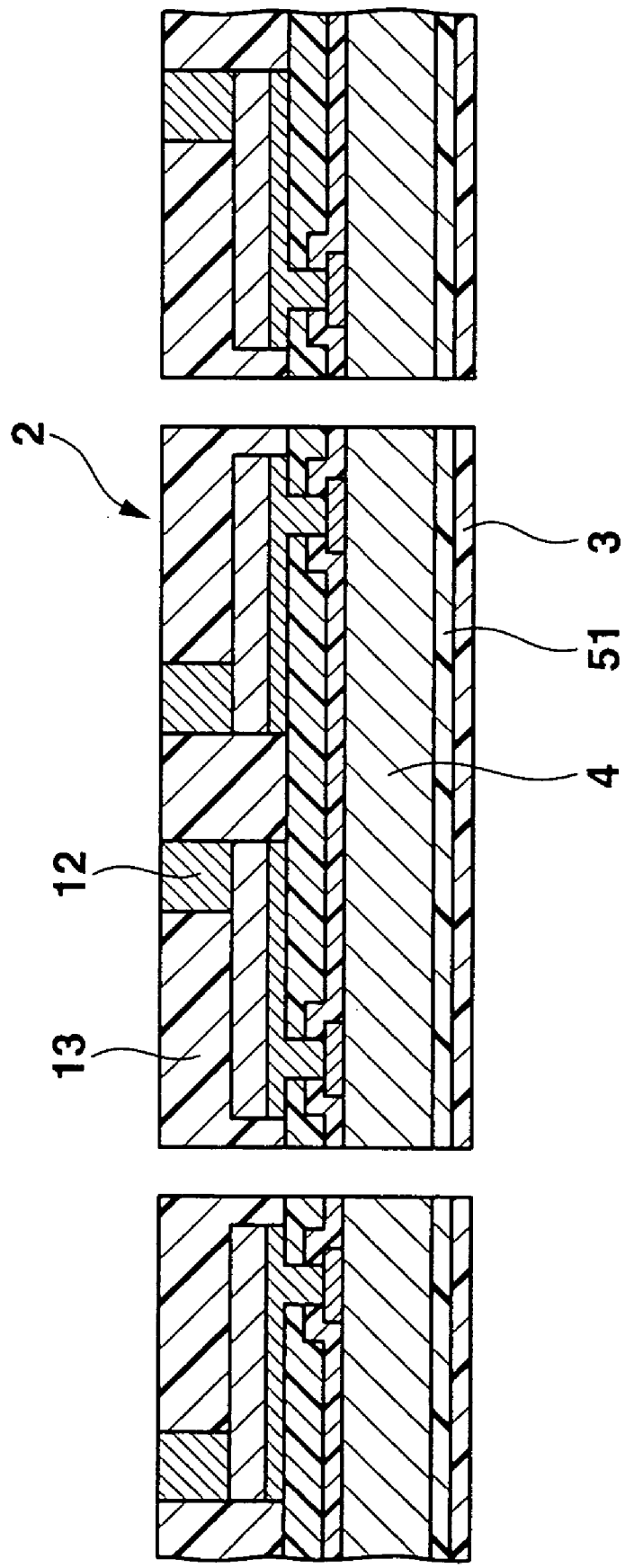
FIG. 22 is a sectional view of a step following FIG. 21.

An example of the fabrication of this semiconductor device is as follows. After the step shown in FIG. 7, as shown in FIG. 21, an adhesion increasing film 51 made of a silane coupling agent is formed on the lower surface of a silicon substrate 4 by screen printing or the like. Then, an adhesive layer 3 made of a die bonding material is adhered in a semi-cured state to the lower surface of the adhesion increasing film 51. As shown in FIG. 22, a plurality of semiconductor constructing bodies 2 each having the adhesion increasing film 51 and adhesive layer 3 on the lower surface of the silicon substrate 4 are obtained through a dicing step.

Figure 23:
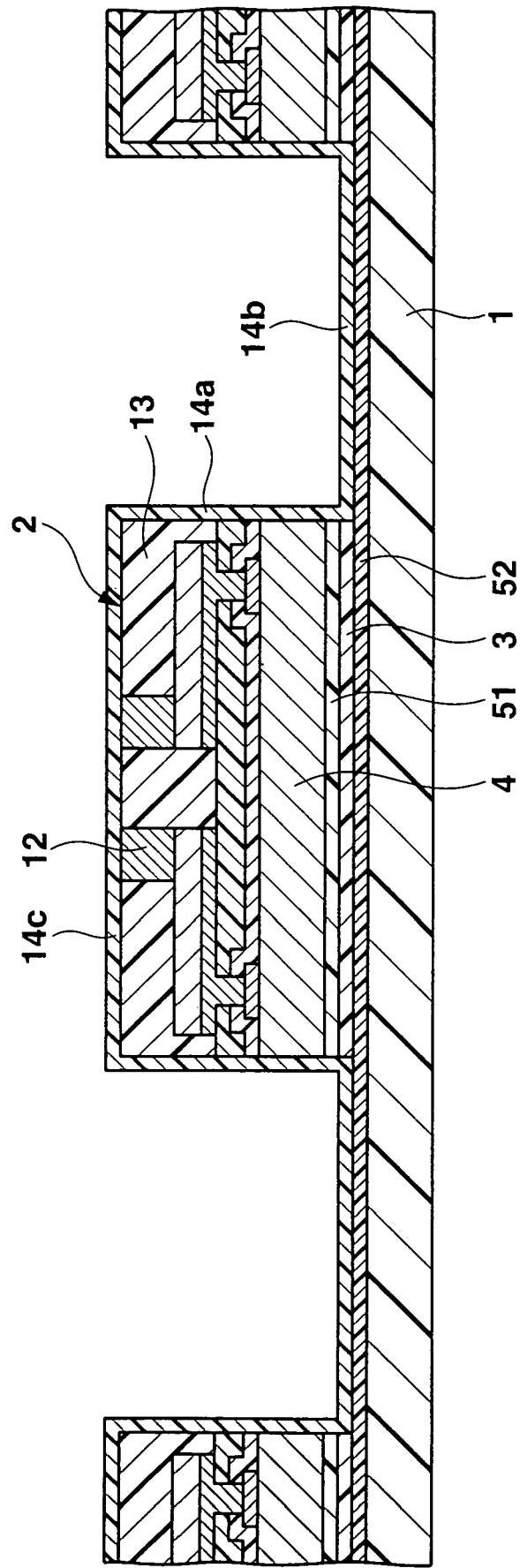
FIG. 23 is a sectional view of a step following FIG. 22.

As shown in FIG. 23, an adhesion increasing film 52 made of a silane coupling agent is formed on the upper surface of a base plate 1 by screen printing or the like. Then, the adhesive layer 3 of the semiconductor constructing body 2 is finally cured and adhered to each of a plurality of predetermined portions on the upper surface of the adhesion increasing film 52. Adhesion increasing films 14a, 14b, and 14c made of a silane coupling agent are then continuously formed on the side surfaces of the semiconductor constructing body 2, on the upper surface of the adhesion increasing film 52 around the semiconductor constructing body 2, and on the upper surface of the semiconductor constructing body 2. After that, a plurality of semiconductor devices shown in FIG. 20 are obtained through the same steps as in the first embodiment.

The semiconductor device thus obtained has the substantially same effects as in the first embodiment. In addition, the adhesion between the silicon substrate 4 and the adhesive layer 3 made of a die bonding material can be increased via the adhesion increasing film 51 formed between them. Also, the adhesion between the base plate 1 made of a material used as a printed board and the adhesive layer 3 made of a die bonding material can be increased via the adhesion increasing film 52 formed between them. Consequently, it is possible to suppress peeling caused by thermal stress and/or mechanical stress between the silicon substrate 4 and adhesive layer 3, and suppress peeling caused by thermal stress or mechanical stress between the base plate 1 and adhesive layer 3.

Third Embodiment

Figure 24:
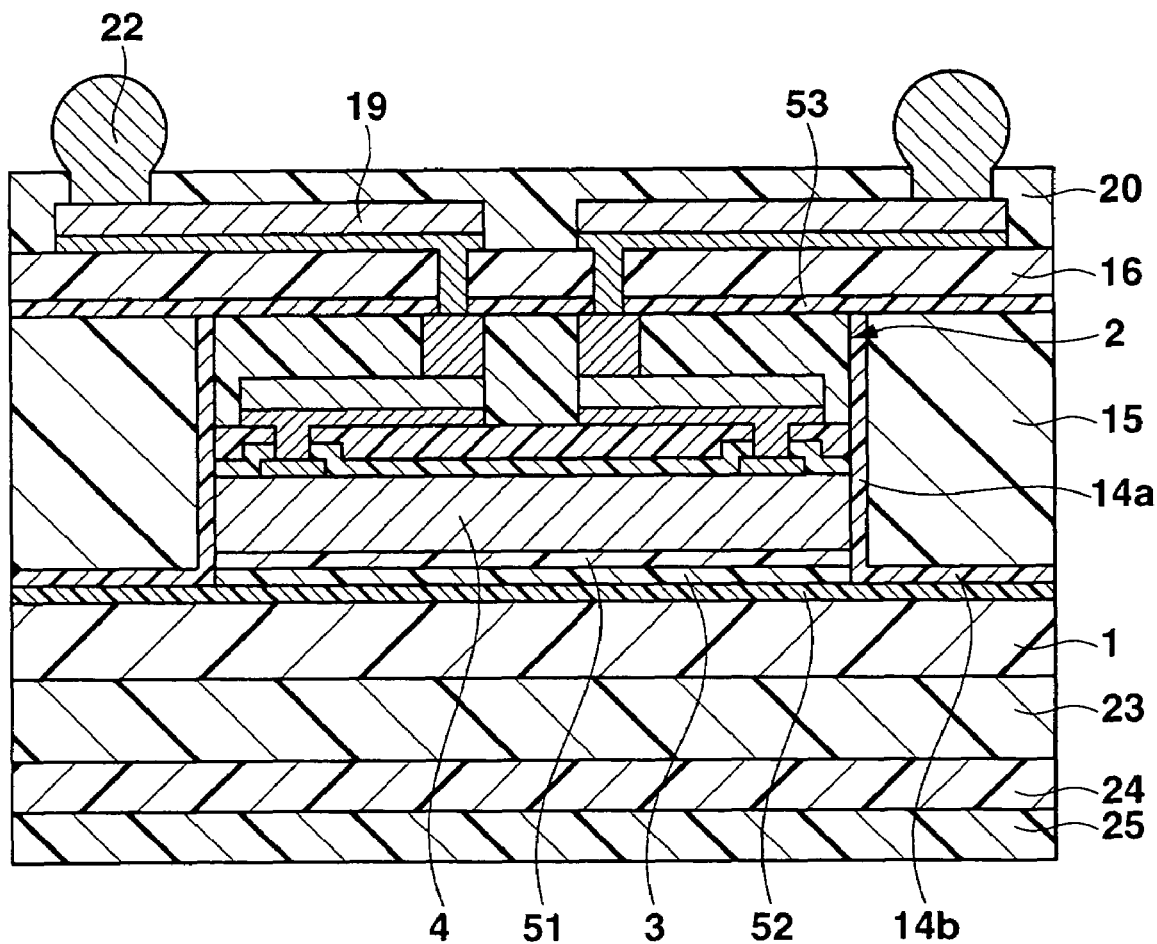
FIG. 24 is a sectional view of a semiconductor device as the third embodiment of the present invention.

FIG. 24 is a sectional view of a semiconductor device as the third embodiment of the present invention. This semiconductor device differs from the semiconductor device shown in FIG. 20 in that the adhesion increasing film 14c formed only on the upper surface of the semiconductor constructing body 2 in FIG. 20 is formed as an adhesive increasing film 53 covering the whole lower surface of an upper insulating film 16, thereby further increasing the adhesion between the upper surfaces of the semiconductor constructing body 2 and the upper insulating film 16, but also between the insulating layer 15 and the latter 16.

Figure 25:
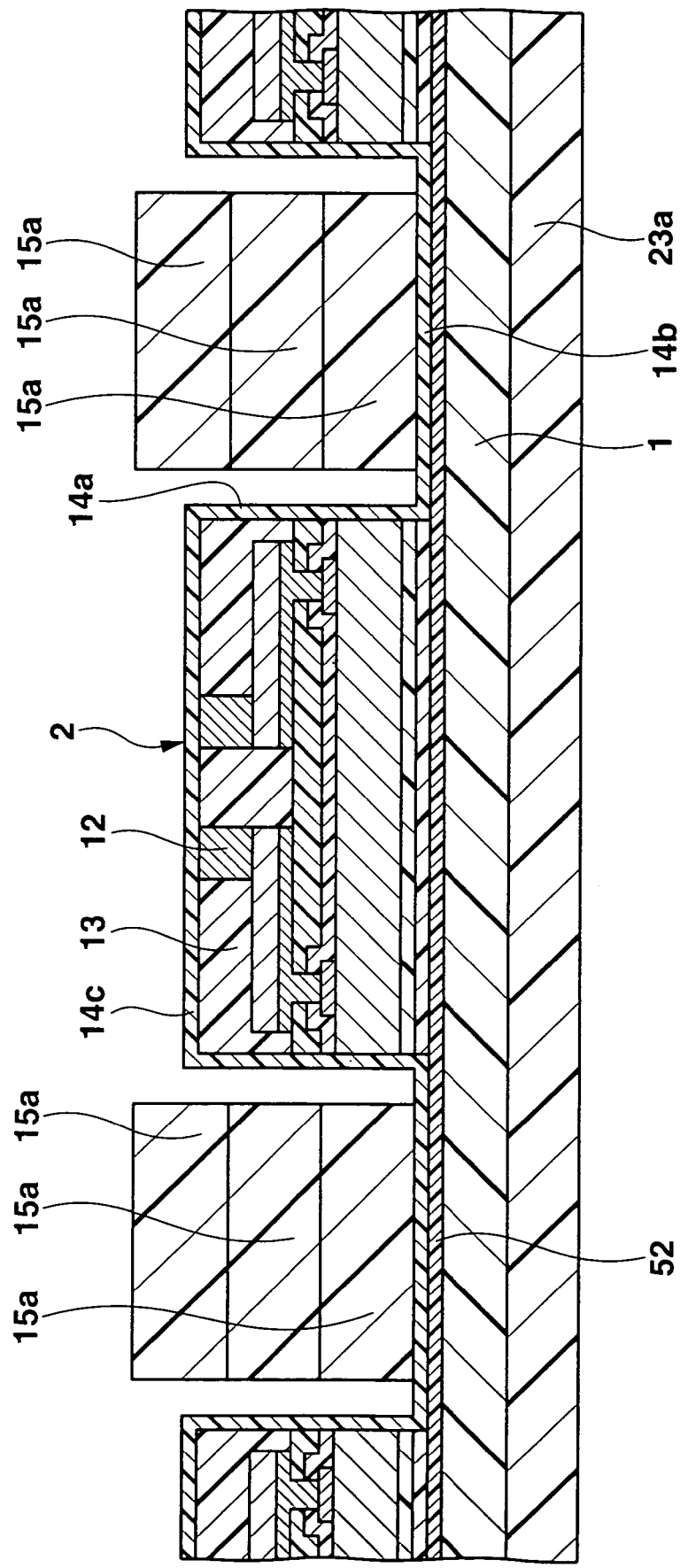
FIG. 25 is a sectional view of a predetermined step when the semiconductor device shown in FIG. 24 is fabricated.

An example of the fabrication of this semiconductor device is as follows. After the step shown in FIG. 23, as shown in FIG. 25, three lattice-like insulating layer formation sheets 15a are stacked, as they are positioned by pins or the like (not shown), on the upper surface of an adhesion increasing film 14b formed on the upper surface of a base plate 1 around an adhesive increasing film 14a formed on the side surfaces of a semiconductor constructing body 2. In addition, a first lower insulating film formation sheet 23a made of the same material as the insulating layer formation sheets 15a is placed on the lower surface of the base plate 1.

Figure 26:
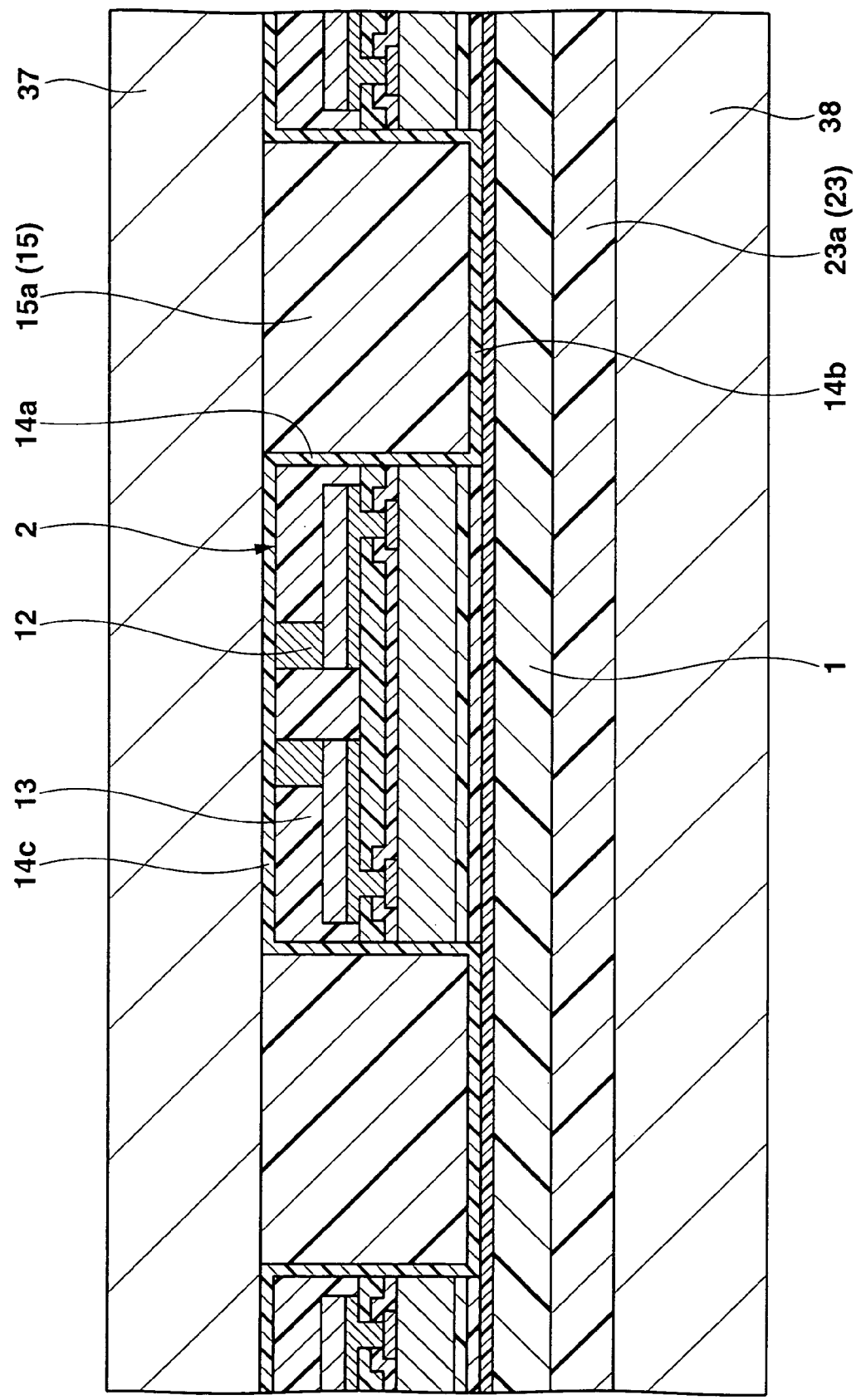
FIG. 26 is a sectional view of a step following FIG. 25.

Then, as shown in FIG. 26, a pair of heating/pressing plates 37 and 38 are used to heat and press the insulating layer formation sheets 15a and first lower insulating film formation sheet 23a from above and below. As a consequence, molten thermosetting resin in the insulating layer formation sheets 15a is pushed outside to form an insulating layer 15 on the upper surface of the adhesion increasing film 14b formed on the upper surface of the base plate 1 around the semiconductor constructing body 2. In addition, a first lower insulating film 23 is formed on the lower surface of the base plate 1.

Figure 27:
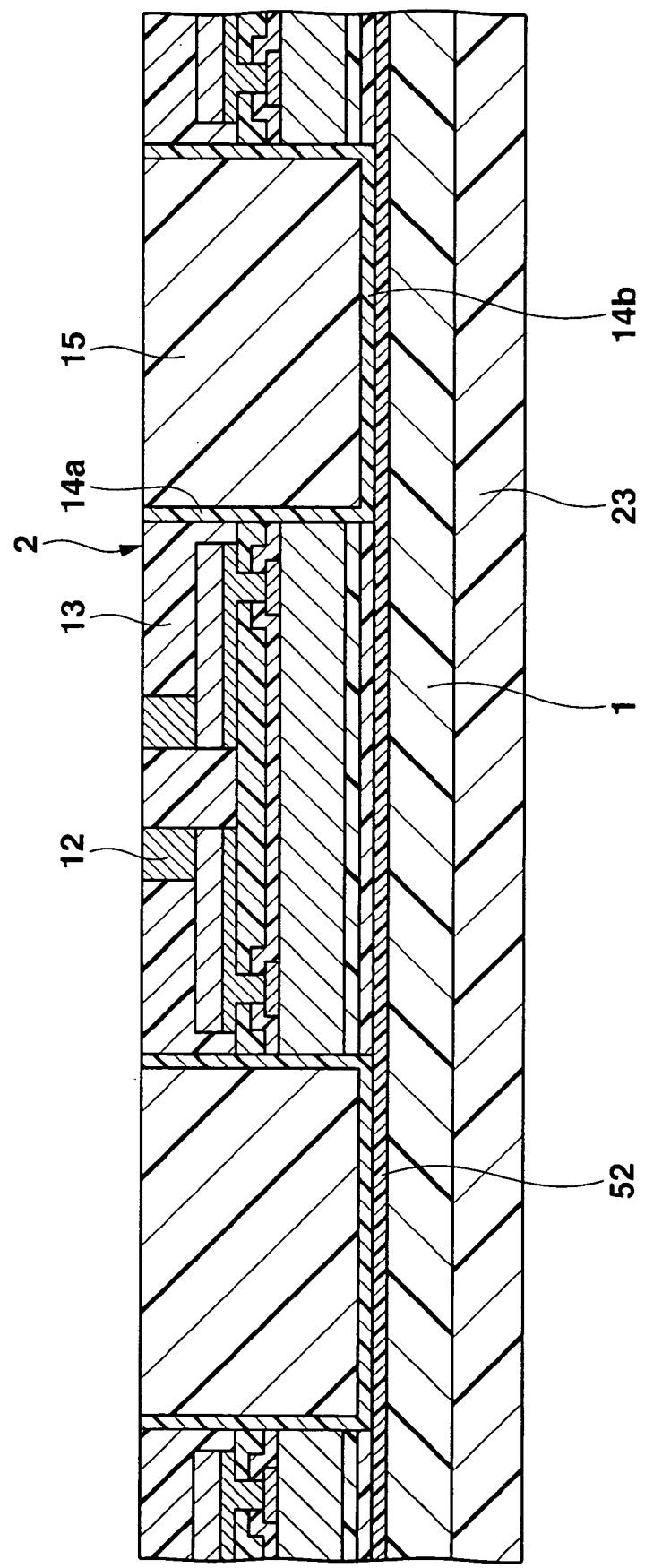
FIG. 27 is a sectional view of a step following FIG. 26.

To remove the extra thermosetting resin and planarize the surface, buffing or the like is performed to completely remove the adhesion increasing film 14c formed on the upper surface of the semiconductor constructing body 2, thereby exposing the upper surfaces of columnar electrodes 12 and sealing film 13 as shown in FIG. 27. Note that in this polishing, it is only necessary to remove the extra thermosetting resin and planarize the surface to some extent, and the adhesion increasing film 14c formed on the upper surface of the semiconductor constructing body 2 need not be completely removed.

Figure 28:
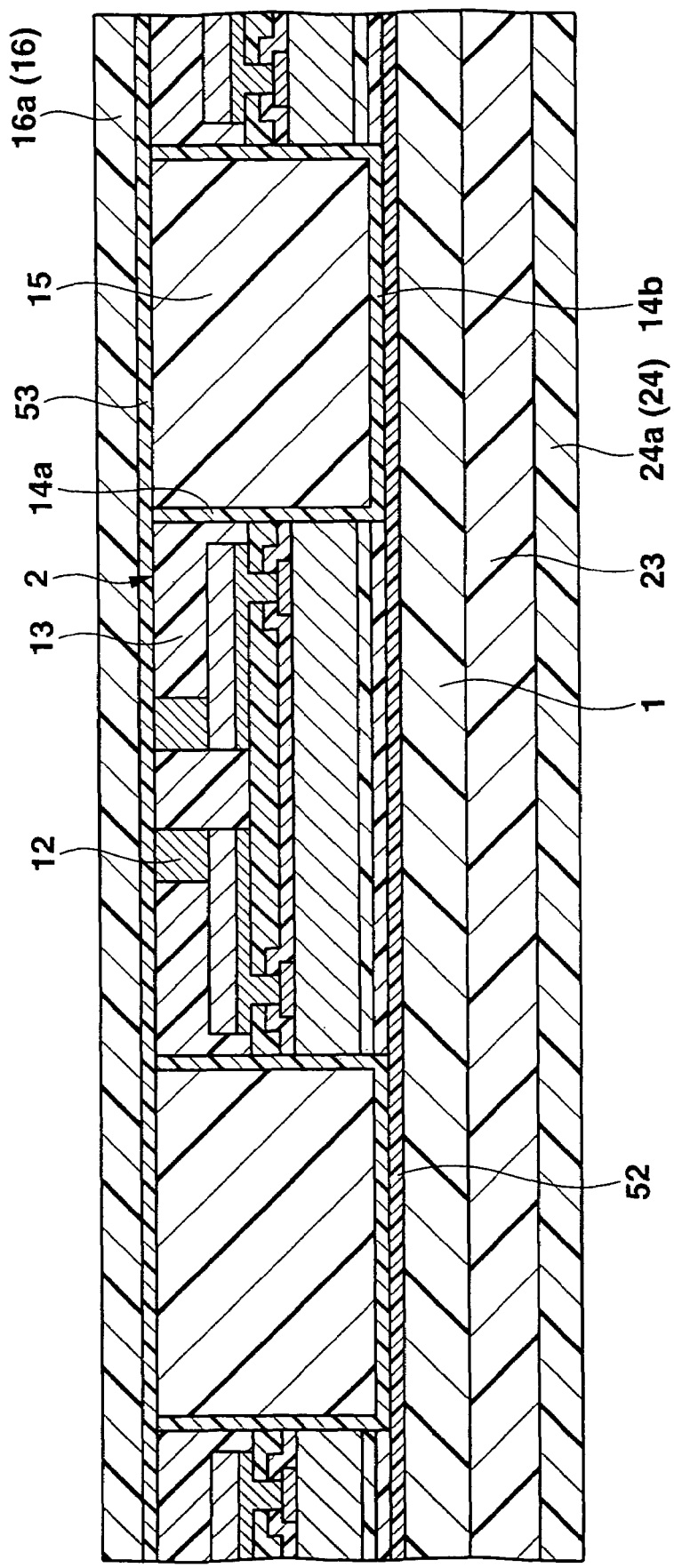
FIG. 28 is a sectional view of a step following FIG. 27.

As shown in FIG. 28, an adhesion increasing film 53 made of a silane coupling agent is formed by screen printing on the upper surfaces of the columnar electrodes 12 and sealing film 13, on the upper surface of the adhesion increasing film 14a formed on the side surfaces of the semiconductor constructing body 2, and on the upper surface of the insulating layer 15. Then, an upper insulating film formation sheet 16a is placed on the upper surface of the adhesion increasing film 53. Also, a second lower insulating film formation sheet 24a made of the same material as the upper insulating film formation sheet 16a is placed on the lower surface of the first lower insulating film 23.

A pair of heating/pressing plates (not shown) are used to heat and press the upper insulating film formation sheet 16a and second lower insulating film formation sheet 24a from above and below. As a consequence, an upper insulating film 16 is formed on the upper surface of the adhesion increasing film 53, and a second lower insulating film 24 is formed on the lower surface of the first lower insulating film 23. As in the first embodiment described previously, no polishing step is necessary to planarize the upper surface of the upper insulating film 16 and the lower surface of the second lower insulating film 24. After that, a plurality of semiconductor devices shown in FIG. 24 are obtained through the same steps as in the first embodiment.

Fourth Embodiment

Figure 29:
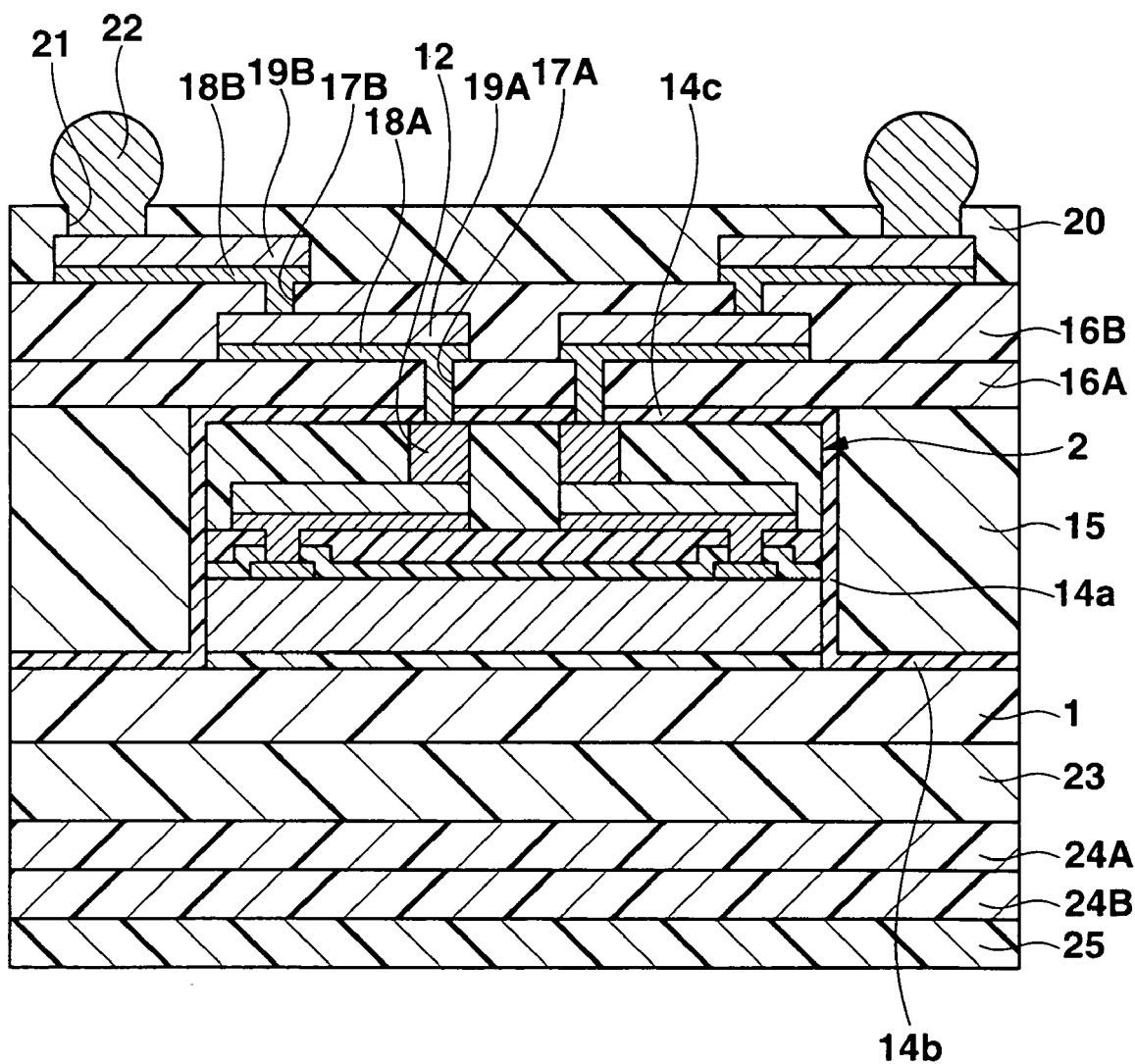
FIG. 29 is a sectional view of a semiconductor device as the fourth embodiment of the present invention.

FIG. 29 is a sectional view of a semiconductor device as the fourth embodiment of the present invention. This semiconductor device largely differs from the semiconductor device shown in FIG. 1 in that each of an upper insulating film, upper interconnection, and lower insulating film has two layers. That is, a second upper insulating film 16B made of the same material as a first upper insulating film 16A is formed on the upper surface of a first upper interconnection 19A and the upper surface of the first upper insulating film 16A. A second upper interconnection 19B is formed on a second upper metal undercoating 18B on the second upper insulating film 16B.

One end portion of the first upper interconnection 19A including the first upper metal undercoating 18A is connected to the upper surface of a columnar electrode 12 through a hole 17A in the first upper insulating film 16A. One end portion of the second upper interconnection 19B including the second upper metal undercoating 18B is connected to a connecting pad portion of the first upper interconnection 19A through a hole 17B in the second upper insulating film 16B. A solder ball 22 is connected to a connecting pad portion of the second upper interconnection 19B through a hole 21 in an uppermost insulating film 20.

To reduce the warpage of a base plate 1 during and after the fabrication process, a second lower insulating film 24A made of the same material as the first upper insulating film 16A is formed on the lower surface of a first lower insulating film 23, a third lower insulating film 24B made of the same material as the second upper insulating film 16B is formed on the lower surface of the second lower insulating film 24A, and a lowermost insulating film 25 made of the same material as the uppermost insulating film 20 is formed on the lower surface of the third lower insulating film 24B. Note that the upper insulating film and upper interconnection may also include three or more layers.

Other Embodiments

In the above device, the adhesion increasing film is formed between the side surfaces of the semiconductor constructing body and the insulating layer, and or between the base member around the semiconductor constructing body and the insulating layer. This makes it possible to increase the adhesion between the semiconductor substrate and the insulating film which covers the side surfaces of the semiconductor substrate, and or the adhesion between the base member and the insulating layer which covers the upper surface of the base member. Consequently, it is possible to suppress peeling caused by thermal stress or mechanical stress between the semiconductor substrate and the insulating layer which covers the side surfaces of the semiconductor substrate, or between the base member and the insulating layer which covers the upper surface of the base member.

In the above embodiments, the semiconductor constructing bodies 2 adjacent to each other are cut apart. However, it is also possible to obtain a multi-chip module type semiconductor device by cutting two or more semiconductor constructing bodies 2 together as one set. In this case, the types of the plurality of semiconductor constructing bodies 2 making one set may be the same or different.

Also, the base plate 1 is not limited to the core material of a printed board, but may also be a substrate obtained by forming a metal foil such as a copper foil on the whole or patterned portions of one or both of the two surfaces of the core material. Other examples are a metal substrate made of copper or stainless steel, a glass plate, and a ceramic plate. Additionally, the base plate 1 is not limited to a single member, but may also be a multilayered printed circuit board in which insulating films and interconnections are alternately stacked.

Furthermore, the above embodiments use the face-up bonding method in which the columnar electrodes 12 as the external connecting electrodes of the semiconductor constructing body 2 face the surface opposite to the base plate 1. However, the present invention is also applicable to a so-called face-down boding method by which the external connecting electrodes of the semiconductor constructing body 2 face the upper surface of the base plate 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a base member;
at least one semiconductor constructing body which is provided on one side of the base member, and which comprises a semiconductor substrate, a plurality of external connecting electrodes provided on the semiconductor substrate, and a sealing film covering circumferential surfaces of the external connecting electrodes;
a peripheral insulating layer provided on said one side of the base member around the at least one semiconductor constructing body;
an upper insulating layer which covers the sealing film of the at least one semiconductor constructing body and the peripheral insulating layer; and
an adhesion increasing film which is formed: (i) between the peripheral insulating layer and sides of the at least one semiconductor constructing body, (ii) between the peripheral insulating layer and the base member around the at least one semiconductor constructing body, and (iii) between the sealing film of the at least one semiconducting body and the upper insulating layer, to prevent peeling between the peripheral insulating layer and the sides of the at least one semiconductor constructing body, between the peripheral insulating layer and the base member around the at least one semiconductor constructing body, and between the sealing film of the at least one semiconductor constructing body and the upper insulating layer.

2. A device according to claim 1, wherein the adhesion increasing film and an adhesive layer are laminated between the base member and the at least one semiconductor constructing body.

3. A device according to claim 2, wherein the at least one semiconductor constructing body is provided on the base member via a lamination of the adhesion increasing film, the adhesive layer, and another adhesion increasing film.

4. A device according to claim 1, further comprising at least one upper interconnecting layer formed above the at least one semiconductor constructing body and the peripheral insulating layer, wherein the at least one upper interconnecting layer is electrically connected to the external connecting electrodes of the at least one semiconductor constructing body, and includes a connecting pad portion.

5. A device according to claim 4, wherein the external connecting electrodes of the at least one semiconductor constructing body include a plurality of columnar electrodes, and wherein the sealing film of the at least one semiconductor constructing body covers circumferential surfaces of the columnar electrodes.

6. A device according to claim 4, wherein the at least one upper interconnecting layer is provided on the upper insulating layer.

7. A device according to claim 6, further comprising another adhesion increasing film provided between the at least one semiconductor constructing body and the upper insulating layer.

8. A device according to claim 4, further comprising an uppermost insulating film which covers a portion except for a connecting pad portion of an uppermost interconnecting layer of the at least one upper interconnecting layer.

9. A device according to claim 8, further comprising a solder ball electrically connected to the connecting pad portion of the uppermost interconnecting layer.

10. A semiconductor device comprising:
   a base member;
   at least one semiconductor constructing body which is provided on one side of the base member, and which comprises a semiconductor substrate and a plurality of external connecting electrodes provided on the semiconductor substrate;
   an insulating layer provided on said one side of the base member around the semiconductor constructing body; and
   an adhesion increasing film which is formed between: (i) the insulating layer, and (ii) at least one of the semiconductor constructing body and the base member around the semiconductor constructing body, to prevent peeling between the insulating layer and said at least one of the semiconductor constructing body and the base member;
   wherein the adhesion increasing film is made of a silane coupling agent.

11. A device according to claim 10, wherein the silane coupling agent is made of a material having $(C_nH_{2n+1}O)_m$—Si—(wherein n, m=1, 2, 3) in a molecule.

* * * * *